US012813088B2

(12) United States Patent
Shin et al.

(10) Patent No.: US 12,813,088 B2
(45) Date of Patent: Nov. 24, 2026

(54) DISPLAY PANEL

(71) Applicant: Samsung Display Co., Ltd., Yongin-si (KR)

(72) Inventors: Hyuneok Shin, Yongin-si (KR); Joonyong Park, Yongin-si (KR); Dongmin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 450 days.

(21) Appl. No.: 18/505,011

(22) Filed: Nov. 8, 2023

(65) Prior Publication Data

US 2024/0164148 A1 May 16, 2024

(30) Foreign Application Priority Data

Nov. 10, 2022 (KR) ........................ 10-2022-0149861

(51) Int. Cl.
*H10K 59/122* (2023.01)
*H10K 59/88* (2023.01)
(Continued)

(52) U.S. Cl.
CPC ........... *H10K 59/122* (2023.02); *H10K 59/88* (2023.02); *H10K 2102/102* (2023.02); *H10K 2102/103* (2023.02); *H10K 2102/351* (2023.02)

(58) Field of Classification Search
CPC ................. H10K 59/122; H10K 59/88; H10K 2102/102; H10K 2102/103;
(Continued)

(56) References Cited

U.S. PATENT DOCUMENTS 9,076,993 B2 7/2015 Kim et al.
9,276,055 B1 3/2016 Son et al.
(Continued)

FOREIGN PATENT DOCUMENTS

CN 102751312 A 10/2012
CN 103928495 A 7/2014
(Continued)

OTHER PUBLICATIONS

English Machine Translation of Gao , CN-114765208-A (Year: 2026).*
(Continued)

*Primary Examiner* — Joseph L Williams
(74) *Attorney, Agent, or Firm* — Womble Bond Dickinson (US) LLP

(57) ABSTRACT

A display panel includes: a base layer; a first electrode on the base layer; a pixel defining layer on the base layer and having a light-emitting opening through the pixel defining layer over a portion of the first electrode; a conductive wall on the pixel defining layer and having a partition opening in the conductive wall corresponding to the light-emitting opening; a second electrode in the partition opening; and a light-emitting pattern in the partition opening and between the first electrode and the second electrode, wherein: the conductive wall comprises a first layer, a second layer on the first layer, and a third layer on the second layer; the second electrode contacts the second layer; and a thickness of the third layer is greater than a thickness of the first layer.

25 Claims, 28 Drawing Sheets

(51) Int. Cl.
*H10K 102/00* (2023.01)
*H10K 102/10* (2023.01)

(58) Field of Classification Search
CPC ........... H10K 2102/351; H10K 59/131; H10K 50/805; H10K 59/805; H10K 59/8051; H10K 59/80521; H10K 59/80522; H10K 50/11
See application file for complete search history.

(56) References Cited

U.S. PATENT DOCUMENTS

| | | | | |
|---|---|---|---|---|
| 9,337,249 | B2 | 5/2016 | Wang et al. | |
| 11,495,645 | B2 | 11/2022 | Kim et al. | |
| 11,502,144 | B2 | 11/2022 | Cho et al. | |
| 11,910,654 | B1 * | 2/2024 | Yeh | H10K 59/353 |
| 2007/0264899 | A1 | 11/2007 | Kumagai | |
| 2016/0365398 | A1 * | 12/2016 | Kim | H10K 59/124 |
| 2020/0258960 | A1 | 8/2020 | Choi | |
| 2021/0020721 | A1 | 1/2021 | Kwack et al. | |
| 2021/0134902 | A1 | 5/2021 | Lee et al. | |
| 2022/0190295 | A1 | 6/2022 | Son et al. | |

FOREIGN PATENT DOCUMENTS

| | | | | | |
|---|---|---|---|---|---|
| CN | 112331801 | A | | 2/2021 | |
| CN | 113241416 | A | | 8/2021 | |
| CN | 113471384 | A | * | 10/2021 | H10K 59/12 |
| CN | 114335121 | A | * | 4/2022 | |
| CN | 114765208 | A | * | 7/2022 | H10K 59/80522 |
| JP | 2008-135325 | A | | 6/2008 | |
| KR | 10-2015-0050204 | A | | 5/2015 | |
| KR | 10-2090555 | B1 | | 3/2020 | |
| KR | 10-2121984 | B1 | | 6/2020 | |
| KR | 10-2020-0099231 | A | | 8/2020 | |
| KR | 10-2021-0002165 | A | | 1/2021 | |
| KR | 10-2021-0016145 | A | | 2/2021 | |
| KR | 10-2022-0085110 | A | | 6/2022 | |

OTHER PUBLICATIONS

English Machine Translation of Yuan et al., CN-113471384-A (Year: 2026).*
English Machine Translation of Wang et al., CN-114335121-A (Year: 2026).*
EPO Extended European Search Report dated Apr. 5, 2024, issued in European Patent Application No. 23209075.3 (8 pages).

* cited by examiner

DISPLAY PANEL

CROSS-REFERENCE TO RELATED APPLICATION

The present application claims priority to and the benefit of Korean Patent Application No. 10-2022-0149861, filed on Nov. 10, 2022, in the Korean Intellectual Property Office, the entire content of which is incorporated herein by reference.

BACKGROUND

1. Field

Aspects of some embodiments of the present disclosure herein relate to a display panel.

2. Description of the Related Art

A display device may be activated according to an electrical signal. The display device may include a display panel that displays images. Regarding the display panel, an organic light-emitting display panel has characteristics such as relatively low power consumption, relatively high luminance, and relatively high response speed.

Among display panels, the organic light-emitting display panel includes an anode, a cathode, and a light-emitting layer. The light-emitting layer is separated for each light-emitting region and the cathode provides a common voltage to each light-emitting region.

The above information disclosed in this Background section is only for enhancement of understanding of the background and therefore the information discussed in this Background section does not necessarily constitute prior art.

SUMMARY

Aspects of some embodiments of the present disclosure herein relate to a display panel, and for example, to a display panel with relatively improved reliability and processability.

According to some embodiments of the present disclosure, a display panel includes a light-emitting element formed without using a metal mask.

According to some embodiments of the present disclosure, a display panel may have relatively increased display efficiency and relatively improved reliability.

According to some embodiments of the present disclosure, a display panel may have relatively improved processability.

According to some embodiments of the present disclosure, a display panel may include: a base layer; a first electrode on the base layer; a pixel defining layer on the base layer and having a light-emitting opening which exposes a portion of the first electrode and is defined in the pixel defining layer; a conductive wall on the pixel defining layer and having a partition opening which corresponds to the light-emitting opening and is defined in the conductive wall; a second electrode in the partition opening; and a light-emitting pattern in the partition opening and between the first electrode and the second electrode, wherein: the conductive wall includes a first layer, a second layer on the first layer, and a third layer on the second layer; the second electrode comes in contact with the second layer; and a thickness of the third layer is greater than a thickness of the first layer.

According to some embodiments, the thickness of the third layer is about 3000 angstroms or more and the thickness of the first layer is about 2000 angstroms or less.

According to some embodiments, the first layer may include a first inner side surface defining a first region of the partition opening, the second layer may include a second inner side surface defining a second region of the partition opening, and the third layer may include a third inner side surface defining a third region of the partition opening.

According to some embodiments, the second inner side surface may be more inward than the first inner side surface and the third inner side surface, and the second electrode may come in contact with the second inner side surface.

According to some embodiments, the second layer may contain copper (Cu), and each of the first layer and the third layer may contain titanium (Ti).

According to some embodiments, the display panel may further include an auxiliary electrode which is on the second electrode, comes in contact with the second inner side surface, and is thicker than the second electrode.

According to some embodiments, the auxiliary electrode may contain a transparent conductive oxide.

According to some embodiments, the second layer may contain silver (Ag), and each of the first layer and the third layer may contain a transparent conductive oxide.

According to some embodiments, the second layer may contain the same material as the second electrode.

According to some embodiments, the conductive wall may further include a first intermediate layer between the second layer and the third layer and containing a material different from that of the third layer, wherein the first intermediate layer may include a fourth inner side surface defining a fourth region of the partition opening and more inward than each of the second inner side surface and the third inner side surface.

According to some embodiments, the first intermediate layer may contain a transparent conductive oxide, and an etch rate of the first intermediate layer may be higher than an etch rate of the third layer.

According to some embodiments, the third layer may contain an indium tin oxide (ITO), and the first intermediate layer may contain any one of an indium gallium zinc oxide (IGZO) and an indium zinc oxide (IZO).

According to some embodiments, a thickness of the first intermediate layer may be greater than a thickness of the light-emitting pattern.

According to some embodiments, the conductive wall may further include a second intermediate layer between the first intermediate layer and the second layer and containing the same material as the third layer, wherein the second intermediate layer may include a fifth inner side surface defining a fifth region of the partition opening and protruding toward the inside of the partition opening from each of the second inner side surface and the fourth inner side surface.

According to some embodiments, the conductive wall may further include: a first intermediate layer between the first layer and the second layer and including a fourth inner side surface defining a fourth region of the partition opening; and a second intermediate layer between the second layer and the third layer and including a fifth inner side surface defining a fifth region of the partition opening, and the second inner side surface may protrude toward the inside of the partition opening from each of the fourth inner side surface and the fifth inner side surface.

According to some embodiments, the second electrode may come in contact with an upper surface of the second layer exposed from the second intermediate layer.

According to some embodiments, a distance between the first layer and the second layer may be smaller than or equal to a sum of the thickness of the light-emitting pattern and the thickness of the second electrode.

According to some embodiments, the fourth inner side surface may be more inward than the third inner side surface.

According to some embodiments, each of the first layer and the second layer may contain a metal nitride, the third layer may contain a metal, and the first intermediate layer and the second intermediate layer may contain a metal different from that of the third layer.

According to some embodiments, an etch rate of each of the first intermediate layer and the second intermediate layer may be higher than that of each of the first layer and the second layer.

According to some embodiments, each of the first layer and the second layer may contain a titanium nitride (TiN), the third layer may contain titanium (Ti), and each of the first intermediate layer and the second intermediate layer may contain aluminum (Al).

According to some embodiments, the conductive wall may further include an upper layer on the third layer and including a sixth inner side surface defining a sixth region of the partition opening, wherein the modulus of the upper layer may be greater than the modulus of the third layer.

According to some embodiments, the conductive wall may receive a bias voltage.

According to some embodiments, the second electrode may contain silver (Ag) or an alloy containing silver (Ag).

According to some embodiments, the display panel may further include a dummy pattern on the conductive wall and spaced apart from the second electrode, wherein the dummy pattern may include a first layer including the same material as the light-emitting pattern and a second layer including the same material as the second electrode.

BRIEF DESCRIPTION OF THE DRAWINGS

The accompanying drawings are included to provide a further understanding of embodiments according to the present disclosure, and are incorporated in and constitute a part of this specification. The drawings illustrate aspects of some embodiments of the present disclosure and, together with the description, serve to explain principles of embodiments according to the present disclosure. In the drawings.

DETAILED DESCRIPTION

Figure 1A:
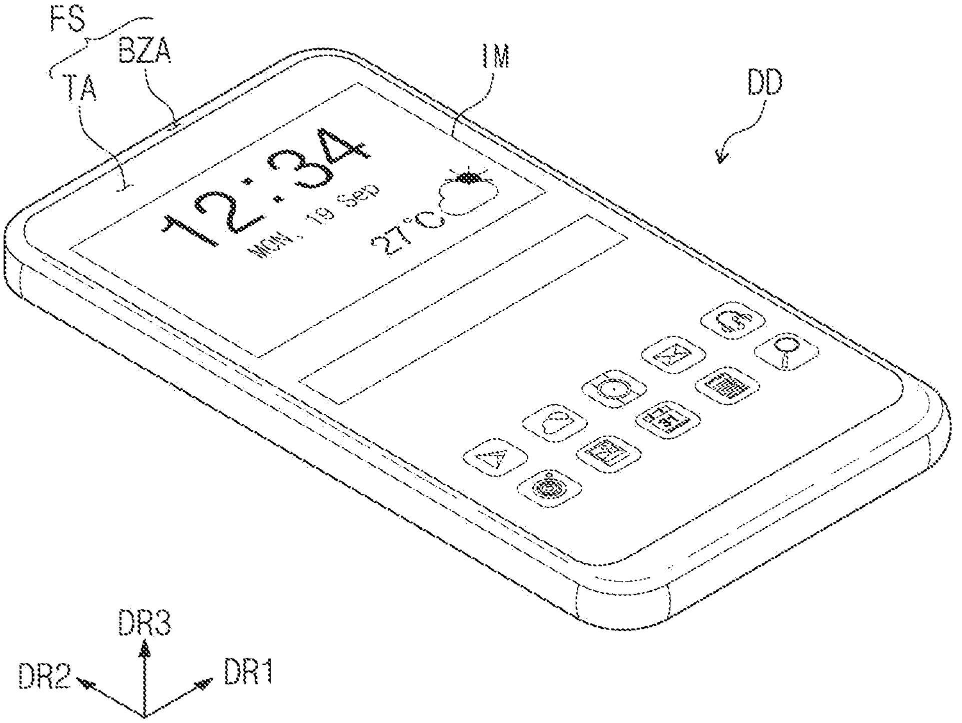
FIG. 1A is a perspective view of a display device according to some embodiments of the present disclosure.

In this specification, it will be understood that when an element (or region, layer, portion, part, etc.) is referred to as being "on", "connected to" or "coupled to" another element, it can be directly on, connected or coupled to the other element, or intervening elements may be present.

Like reference numerals refer to like elements throughout. In addition, in the drawings, the thicknesses, ratios, and dimensions of elements are exaggerated for effective description of the technical contents. As used herein, the term "and/or" includes any and all combinations that the associated configurations can define.

It will be understood that, although the terms first, second, etc. may be used herein to describe various elements, these elements should not be limited by these terms. These terms are only used to distinguish one element from another element. For example, a first element could be termed a second element without departing from the scope of the present invention. Similarly, the second element may also be referred to as the first element. The terms of a singular form include plural forms unless otherwise clearly specified.

In addition, terms, such as "below", "lower", "above", "upper" and the like, are used herein for ease of description to describe one element's relation to another element(s) as illustrated in the figures. The above terms are relative concepts and are described based on the directions indicated in the drawings.

It will be understood that the terms "include" and/or "have", when used in this specification, specify the presence of stated features, integers, steps, operations, elements, components and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, aspects of some embodiments of the present disclosure will be described in more detail with reference to the drawings.

Figure 1B:
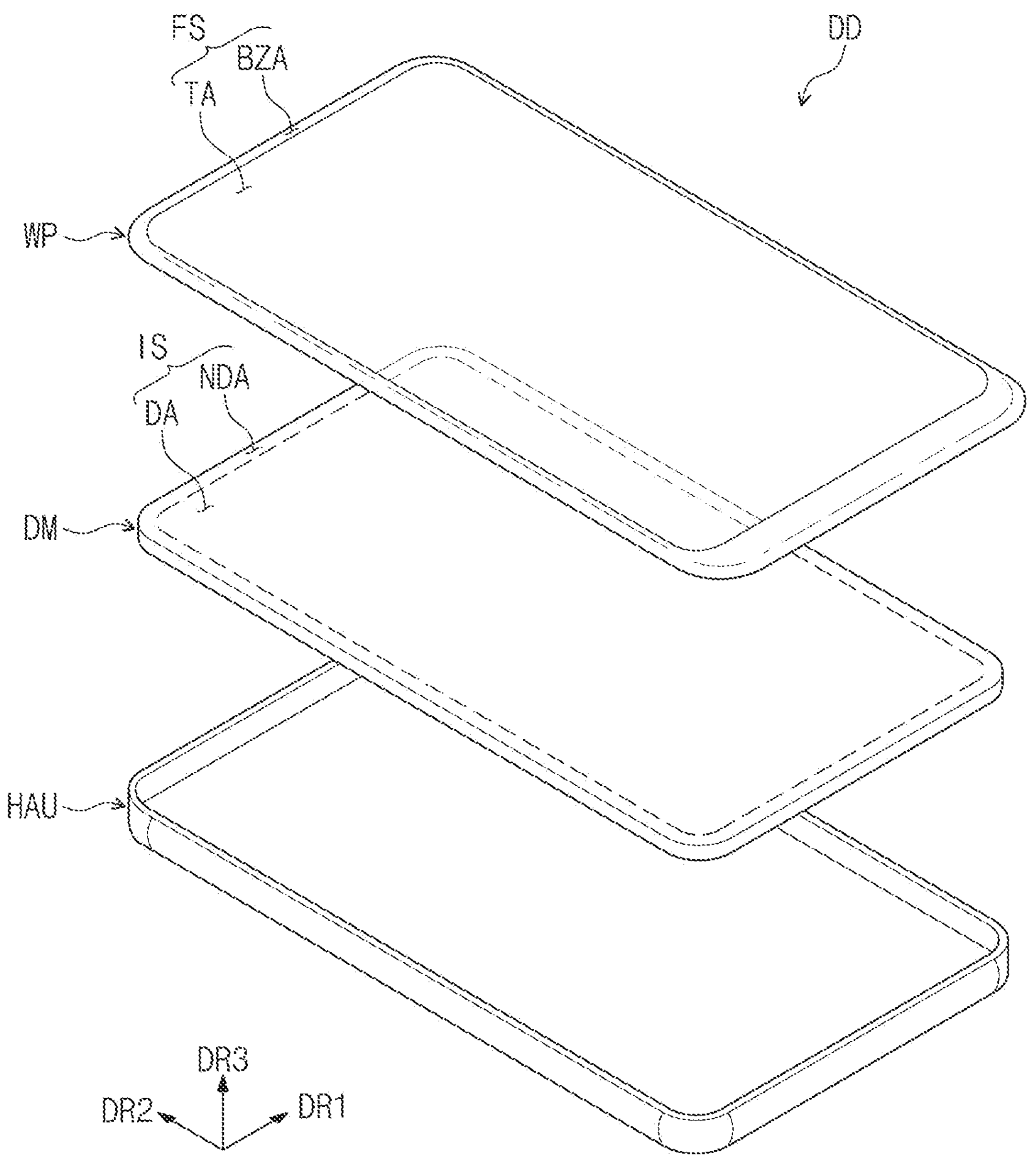
FIG. 1B is an exploded perspective view of the display device according to some embodiments of the present disclosure.
Figure 2:
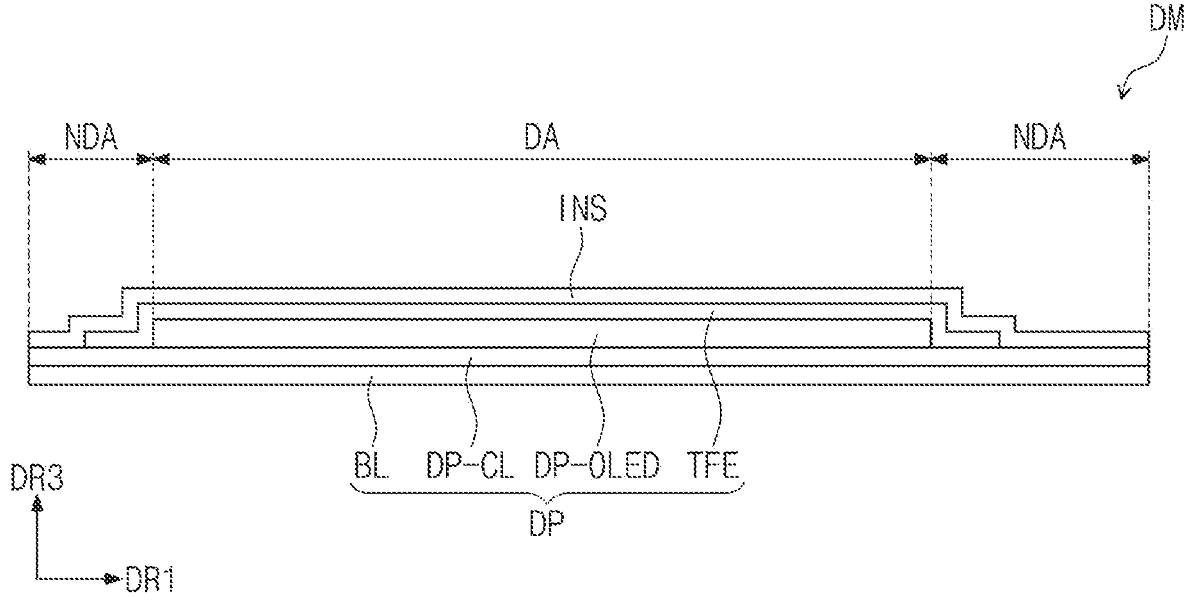
FIG. 2 is a cross-sectional view of a display module according to some embodiments of the present disclosure.

FIG. 1A is a perspective view of a display device according to some embodiments of the present disclosure. FIG. 1B is an exploded perspective view of the display device according to some embodiments of the present disclosure. FIG. 2 is a cross-sectional view of a display module according to some embodiments of the present disclosure.

According to some embodiments of the present disclosure, the display device DD may be a large electronic device such as a television, a monitor, or an external billboard. In addition, the display device DD may be a small or medium-sized electronic device such as a personal computer, a notebook computer, a personal digital terminal, a car navigation unit, a game machine, a smart phone, a tablet, and a camera. These are only presented as examples and may be employed in other display devices as long as they do not depart from the spirit and scope of embodiments according to the present disclosure. According to some embodiments, the display device DD is exemplarily illustrated as a smart phone.

Referring to FIGS. 1A, 1B, and 2, the display device DD may display an image IM toward a third direction DR3 on a display surface FS parallel to each of a first direction DR1 and a second direction DR2. The image IM may include a still image as well as a dynamic image. In FIG. 1, a watch window and icons are illustrated as an example of the image IM. The display surface FS on which the image IM is displayed may correspond to the front surface of the display device DD.

According to some embodiments, the front surface (or upper surface) and the rear surface (or lower surface) of each member are defined based on a direction in which the image IM is displayed. The front surface and the rear surface face each other in the third direction DR3, and a normal direction of each of the front surface and the rear surface may be parallel to the third direction DR3. Meanwhile, directions indicated by the first to third directions DR1, DR2, and DR3 are relative concepts and may be converted into other directions. In this specification, the expression "on a plane" may mean when viewed from the third direction DR3.

As illustrated in FIG. 1B, the display device DD according to some embodiments may include a window WP, a display module DM, and a housing HAU. The window WP and the housing HAU may be coupled to each other to configure the exterior of the display device DD.

The window WP may contain an optically transparent insulating material. For example, the window WP may contain glass or plastic. The front surface of the window WP may define the display surface FS of the display device DD. The display surface FS may include a transmission region TA and a bezel region BZA. The transmission region TA may be an optically transparent region. For example, the transmission region TA may have a visible light transmittance of about 90% or more.

The bezel region BZA may have a relatively low light transmittance, compared to the transmission region TA. The bezel region BZA may define the shape of the transmission region TA. The bezel region BZA may be adjacent to and surround the transmission region TA. Meanwhile, this is illustrated as an example, and in the window WP according to some embodiments of the present disclosure, the bezel region BZA may be omitted. The window WP may include at least one functional layer among an anti-fingerprint layer, a hard coating layer, and an anti-reflection layer and is not limited to any one embodiment.

The display module DM may be located below the window WP. The display module DM may be a component that substantially generates an image IM. The image IM generated by the display module DM is displayed on the display surface IS of the display module DM and is visually recognized by a user from the outside through the transmission region TA.

The display module DM includes a display region DA and a non-display region NDA. The display region DA may be activated according to an electrical signal. The non-display region NDA is adjacent to the display region DA. The non-display region NDA may surround the display region DA. The non-display region NDA is covered by the bezel region BZA and may not be visually recognized from the outside.

As illustrated in FIG. 2, the display module DM according to some embodiments may include a display panel DP and an input sensor INS. Although not separately illustrated, the display device DD according to some embodiments of the present disclosure may further include a protection member located on the lower surface of the display panel DP or an anti-reflection member and/or a window member located on the upper surface of the input sensor INS.

The display panel DP may be a light-emitting display panel and is not particularly limited thereto. For example, the display panel DP may be an organic light-emitting display panel or an inorganic light-emitting display panel. A light-emitting layer in the organic light-emitting display panel contains an organic light-emitting material. A light emitting-layer in the inorganic light-emitting display panel contains quantum dots, quantum rods, or micro LEDs. Hereinafter, the display panel DP will be described as an organic light-emitting display panel.

The display panel DP may include a base layer BL, a circuit element layer DP-CL, a display element layer DP-OLED, and a thin film encapsulation layer TFE located on the base layer BL. The input sensor INS may be located directly on the thin film encapsulation layer TFE. In this specification, the expression "component A is located directly on component B" means that no adhesive layer is located between component A and component B.

The base layer BL may include at least one plastic film. The base layer BL is a flexible substrate and may include a plastic substrate, a glass substrate, a metal substrate, an organic/inorganic composite material substrate, or the like. In this specification, the display region DA and the non-display region NDA may be regarded as being defined in the base layer BL, and in this case, the components located on the base layer BL may also be regarded as being arranged to overlap the display region DA or the non-display region NDA.

The circuit element layer DP-CL includes at least one insulating layer and a circuit element. The insulating layer includes at least one inorganic layer and at least one organic layer. The circuit element includes signal lines, a pixel driving circuit, and the like.

The display element layer DP-OLED includes a conductive wall and a light-emitting element. The light-emitting element may include an anode, a light-emitting pattern, and a cathode, and the light-emitting pattern may include at least a light-emitting layer.

The thin film encapsulation layer TFE includes a plurality of thin films. Some thin films are arranged to improve optical efficiency, and other thin films are arranged to protect organic light-emitting diodes.

The input sensor INS acquires the coordinate information of an external input. The input sensor INS may have a multi-layered structure. The input sensor INS may include a single conductive layer or multiple conductive layers. The input sensor INS may include a single insulating layer or multiple insulating layers. The input sensor INS may sense an external input, for example, in a capacitive manner. According to some embodiments of the present disclosure, the operation manner of the input sensor INS is not particularly limited thereto, and according to some embodiments of the present disclosure, the input sensor INS may sense an external input in an electromagnetic induction manner or a pressure-sensing manner. Meanwhile, according to some embodiments of the present disclosure, the input sensor INS may be omitted.

As illustrated in FIG. 1B, the housing HAU may be coupled to the window WP. The housing HAU may be coupled to the window WP to provide an internal space (e.g., a set or predetermined internal space). The display module DM may be accommodated in the internal space.

The housing HAU may contain a material having relatively high rigidity. For example, the housing HAU may include a plurality of frames and/or plates composed of glass, plastic, or metal, or a combination thereof. The housing HAU may stably protect the components of the display device DD, which are accommodated in the internal space, from an external impact.

Figure 3:
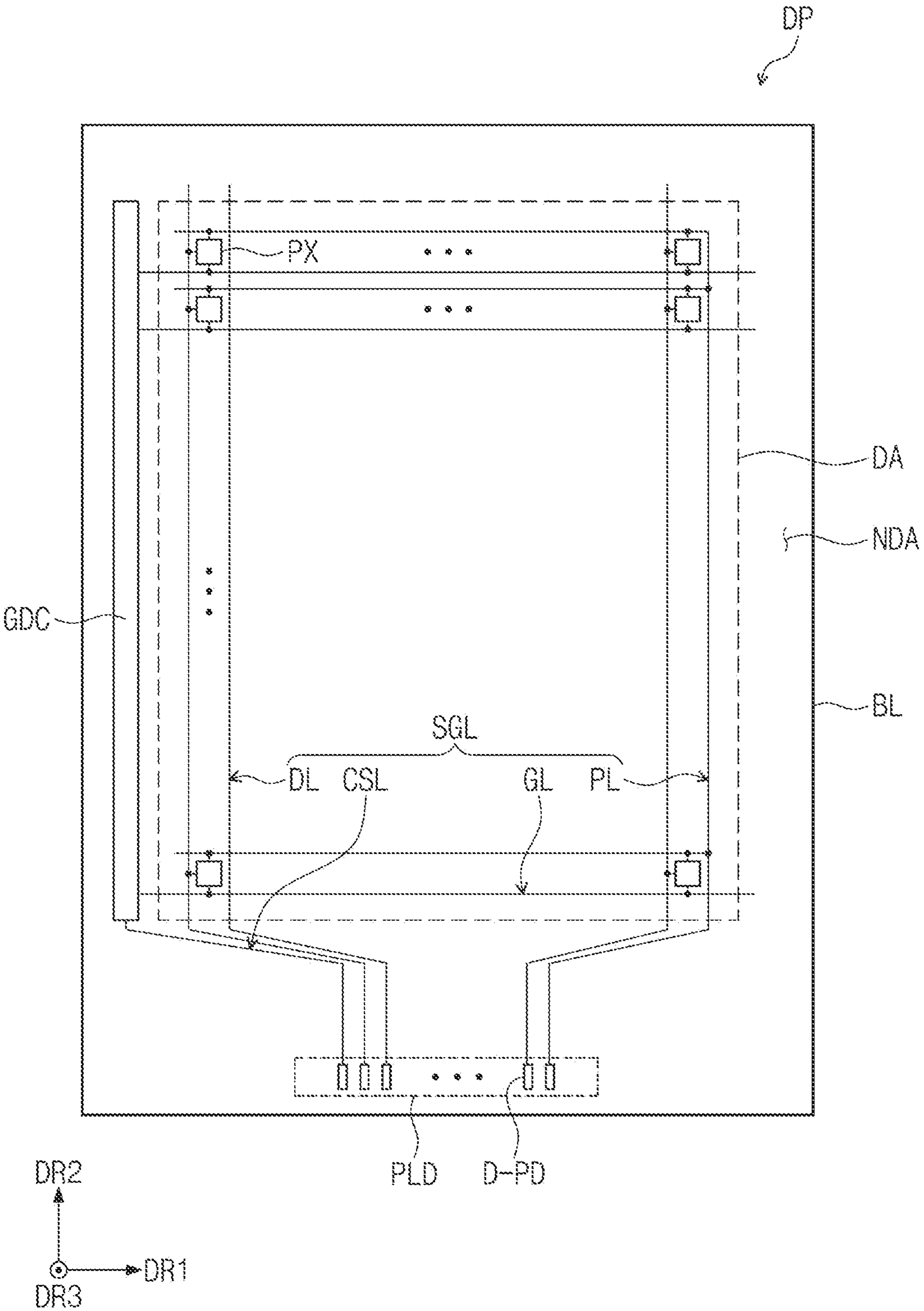
FIG. 3 is a plan view of a display panel according to some embodiments of the present disclosure.

FIG. 3 is a plan view of a display panel according to some embodiments of the present disclosure.

Referring to FIG. 3, the display panel DP may include a base layer BL divided into a display region DA and a non-display region NDA which are described with reference to FIG. 2.

The display panel DP may include pixels PX located in the display region DA and signal lines SGL electrically connected to the pixels PX. The display panel DP may include a driving circuit GDC and a pad portion PLD which are located in the non-display region NDA.

The pixels PX may be arranged in the first and second directions DR1 and DR2. The pixels PX may include: a plurality of pixel rows extending in the first direction DR1 and arranged in the second direction DR2; and a plurality of pixel columns extending in the second direction DR2 and arranged in the first direction DR1.

The signal lines SGL may include gate lines GL, data lines DL, a power line PL, and a control signal line CSL. Each of the gate lines GL may be connected to a corresponding pixel of the pixels PX, and each of the data lines DL may be connected to a corresponding pixel of the pixels PX. The power line PL may be electrically connected to the pixels PX. The control signal line CSL may be connected to the driving circuit GDC to provide control signals to the driving circuit GDC.

The driving circuit GDC may include a gate driving circuit. The gate driving circuit may generate gate signals and sequentially output the generated gate signals to the gate lines GL. The gate driving circuit may further output another control signal to the pixel driving circuit.

The pad portion PLD may be a portion to which a flexible circuit board is connected. The pad portion PLD may include pixel pads D-PD, wherein the pixel pads D-PD may be pads configured to connect the flexible circuit board to the display panel DP. Each of the pixel pads D-PD may be connected to a corresponding signal line of the signal lines SGL. The pixel pads D-PD may be connected to corresponding pixels PX through the signal lines SGL. In addition, one of the pixel pads D-PD may be connected to the driving circuit GDC.

In addition, the pad portion PLD may further include input pads. The input pads may be pads configured to connect the flexible circuit board to the input sensor INS (see FIG. 2). Without being limited thereto, however, the input pads may be located on the input sensor INS (see FIG. 2) and connected to the pixel pads D-PD and a separate circuit board. Alternatively, the input sensor INS (see FIG. 2) may be omitted and may not include additional input pads.

Figure 4:
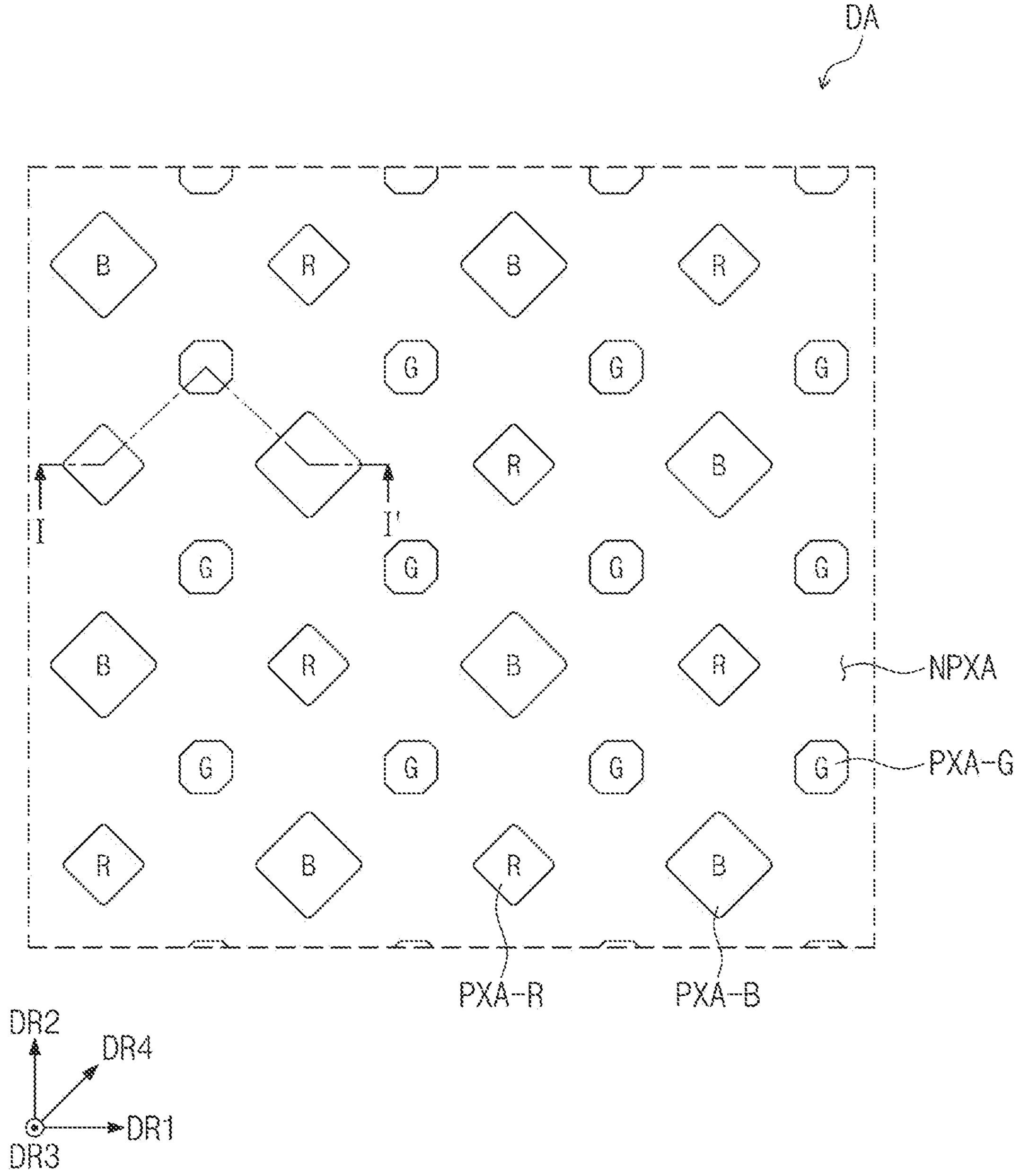
FIG. 4 is an enlarged plan view of a portion of a display region of the display panel according to some embodiments of the present disclosure.

FIG. 4 is an enlarged plan view of a portion of a display region of the display panel according to some embodiments of the present disclosure. FIG. 4 illustrates a plane of the display module DM (see FIG. 2) viewed from the display surface IS (see FIG. 1B) of the display module DM (see FIG. 2), and shows the arrangement of light-emitting regions PXA-R, PXA-G, and PXA-B.

Referring to FIG. 4, the display region DA may include first to third light-emitting regions PXA-R, PXA-G and PXA-B and a peripheral region NPXA surrounding the first to third light-emitting regions PXA-R, PXA-G, and PXA-B. The first to third light-emitting regions PXA-R, PXA-G, and PXA-B may respectively correspond to regions from which light provided from light-emitting elements ED1, ED2, and ED3 (see FIG. 5) is emitted. The first to third light-emitting regions PXA-R, PXA-G, and PXA-B may be classified according to a color of light emitted toward the outside of the display module DM (see FIG. 2).

The first to third light-emitting regions PXA-R, PXA-G, and PXA-B may respectively provide first to third color lights having different colors. For example, the first color light may be red light, the second color light may be green light, and the third color light may be blue light. However, the first to third color lights are not necessarily limited to the above examples.

Each of the first to third light-emitting regions PXA-R, PXA-G, and PXA-B may be defined as a region in which the upper surface of the anode is exposed by a light-emitting opening to be described later. The peripheral region NPXA may determine boundaries between the first to third light-emitting regions PXA-R, PXA-G, and PXA-B, and prevent color mixing between the first to third light-emitting regions PXA-R, PXA-G, and PXA-B.

Each of the first to third light-emitting regions PXA-R, PXA-G, and PXA-B may be provided in plurality and the plurality thereof may be repeatedly arranged (e.g., in a set or predetermined arrangement form) in the display region DA. For example, the first and third light-emitting regions PXA-R and PXA-B may be alternately arranged along the first direction DR1 to form a ‘first group’. The second light-emitting regions PXA-G may be arranged along the first direction DR1 to form a ‘second group’. Each of the ‘first group’ and the ‘second group’ may be provided in plurality, and the ‘first groups’ and the ‘second groups’ may be alternately arranged along the second direction DR2.

One second light-emitting region PXA-G may be arranged to be spaced apart from one first light-emitting region PXA-R or one third light-emitting region PXA-B in a fourth direction DR4. The fourth direction DR4 may be defined as a direction between the first and second directions DR1 and DR2.

Meanwhile, FIG. 4 exemplarily illustrates an arrangement of the first to third light-emitting regions PXA-R, PXA-G, and PXA-B, but the embodiments of the present disclosure are not limited thereto, and the first to third light-emitting regions PXA-R, PXA-G, and PXA-B may be arranged in various forms. According to some embodiments of the present disclosure, the first to third light-emitting regions PXA-R, PXA-G, and PXA-B may have a PENTILE™ arrangement form as illustrated in FIG. 4. Alternatively, the first to third light-emitting regions PXA-R, PXA-G, and PXA-B may have a stripe arrangement form or a Diamond Pixel™ arrangement form.

The first to third light-emitting regions PXA-R, PXA-G, and PXA-B may have various shapes on a plane. For example, the first to third light-emitting regions PXA-R, PXA-G, and PXA-B may have a polygonal shape, a circular shape, an elliptical shape, or the like. FIG. 4 exemplarily illustrates, on a plane, the first and third light-emitting regions PXA-R and PXA-B having a quadrangular shape (or a diamond shape) and the second light-emitting region PXA-G having an octagonal shape.

On a plane, the first to third light-emitting regions PXA-R, PXA-G, and PXA-B may have the same shape as each other, or at least some of them may have different shapes. FIG. 4 exemplarily illustrates, on a plane, the first and third light-emitting regions PXA-R and PXA-B having the same shape as each other and the second light-emitting region PXA-G having a shape different from that of the first and third light-emitting regions PXA-R and PXA-B.

At least some of the first to third light emitting regions PXA-R, PXA-G, and PXA-B may have areas different from each other on a plane. According to some embodiments of the present disclosure, the area of the first light-emitting region PXA-R configured to emit red light may be larger than the area of the second light-emitting region PXA-G configured to emit green light and smaller than the area of the third light-emitting region PXA-B configured to emit blue light. However, the size relationship between the areas of the first to third light-emitting regions PXA-R, PXA-G, and PXA-B according to the color of emitted light is not limited thereto and may vary depending on the design of the display module DM (see FIG. 2). In addition, embodiments of the present disclosure are not limited thereto, and the first to third light-emitting regions PXA-R, PXA-G, and PXA-B may have the same area as each other on a plane.

Meanwhile, the shape, area, and arrangement of the first to third light-emitting regions PXA-R, PXA-G, and PXA-B of the display module DM (see FIG. 2) according to some embodiments of the present disclosure may be designed in various ways according to the color of emitted light or the size and configuration of the display module DM (see FIG. 2) and are not limited to the embodiments illustrated and described with respect to FIG. 4.

Figure 5:
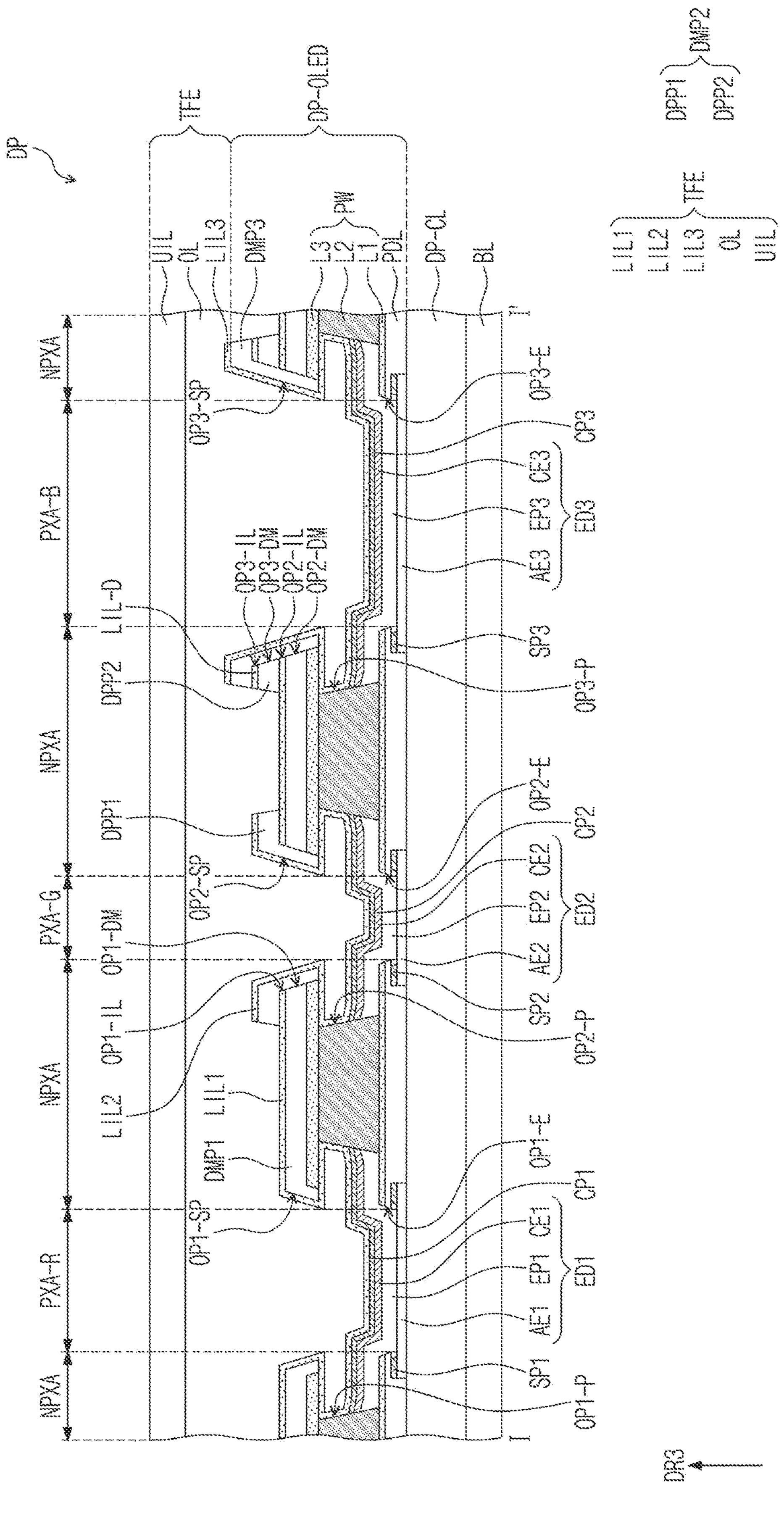
FIG. 5 is a cross-sectional view of the display panel according to some embodiments of the present disclosure, which is taken along the line I-I' of FIG. 4.

FIG. 5 is a cross-sectional view of the display panel according to some embodiments of the present disclosure, which is taken along the line I-I' of FIG. 4.

Referring to FIG. 5, the display panel DP according to some embodiments may include a base layer BL, a circuit element layer DP-CL, a display element layer DP-OLED, and a thin film encapsulation layer TFE.

The display panel DP may include a plurality of insulating layers, semiconductor patterns, conductive patterns, signal lines, and the like. An insulating layer, a semiconductor layer, and a conductive layer are formed by coating, deposition, or the like. Hereafter, the insulating layer, the semiconductor layer, and the conductive layer may be selectively patterned through photolithography and etching processes. In this way, the semiconductor patterns, the conductive patterns, the signal lines, and the like included in the circuit element layer DP-CL and the display element layer DP-OLED are formed.

The circuit element layer DP-CL is illustrated as a single layer, but this is only for easy explanation, and the circuit element layer DP-CL may include an insulating layer, a semiconductor pattern, a conductive pattern, and the like for forming various elements.

The pixel driving circuit in the circuit element layer DP-CL may be provided in plurality, and the pixel driving circuits may be respectively connected to and independently control the light-emitting elements ED1, ED2, and ED3. Each of the pixel driving circuits may include: a plurality of transistors configured to drive the connected light-emitting elements; at least one capacitor; and signal lines configured to connect them.

A display element layer DP-OLED may be located on the circuit element layer DP-CL. According to some embodiments, the display element layer DP-OLED may include light-emitting elements ED1, ED2, and ED3, a pixel defining layer PDL, a conductive wall PW, dummy patterns DMP1, DMP2, and DMP3, and a dummy inorganic layer LIL-D.

The light-emitting elements ED1, ED2, and ED3 include a first light-emitting element ED1, a second light-emitting element ED2, and a third light-emitting element ED3, and each of the first to third light-emitting elements ED1, ED2, and ED3 includes an anode (or first electrode), a cathode (or second electrode), and a light-emitting pattern located between the anode and the cathode. The first light-emitting element ED1 may include a first anode AE1, a first cathode CE1, and a first light-emitting pattern EP1, the second light-emitting element ED2 may include a second anode AE2, a second cathode CE2, and a second light-emitting pattern EP2, and the third light-emitting element ED3 may include a third anode AE3, a third cathode CE3, and a third light-emitting pattern EP3.

The first to third anodes AE1, AE2, and AE3 (or first-first, first-second, and first-third electrodes) may be provided in a plurality of patterns. The first to third anodes AE1, AE2, and AE3 may have conductivity. For example, each of the anodes AE1, AE2, and AE3 may be formed of various materials, such as a metal, a transparent conductive oxide (TCO), or a conductive polymer material, as long as they have conductivity. For example, the metal may include gold (Au), silver (Ag), aluminum (Al), magnesium (Mg), lithium (Li), molybdenum (Mo), copper (Cu), or an alloy. The transparent conductive oxide may include an indium tin oxide (ITO), an indium zinc oxide (IZO), a zinc oxide, an indium oxide, an indium gallium oxide, or an aluminum zinc oxide.

Each of the first to third anodes AE1, AE2, and AE3 is illustrated as a single layer, but this is an example, and each of the first to third anodes AE1, AE2, and AE3 may have a multi-layered structure, any one of the first to third anodes AE1, AE2, and AE3 may have a single-layered structure, and one of them may have a multi-layered structure, and embodiments according to the present disclosure are not limited to any one embodiment.

Each of the first to third light-emitting patterns EP1, EP2, and EP3 may be located on a corresponding anode among the first to third anodes AE1, AE2, and AE3. The first to third light-emitting patterns EP1, EP2, and EP3 may be patterned by a tip portion defined in a conductive wall PW, which will be described later.

According to some embodiments of the present disclosure, the first light-emitting pattern EP1 may provide red light, the second light-emitting pattern EP2 may provide green light, and the third light-emitting pattern EP3 may provide blue light.

Each of the first to third light-emitting patterns EP1, EP2, and EP3 may include a light-emitting layer containing a light-emitting material. Each of the first to third light-emitting patterns EP1, EP2, and EP3 may further include a hole injection layer HIL and a hole transport layer HTL which are located between the light-emitting layer and a corresponding anode among the first to third anodes AE1, AE2, and AE3 and may further include an electron transport layer ETL and an electron injection layer EIL which are located on the light-emitting layer. The first to third light-emitting patterns EP1, EP2, and EP3 may be respectively referred to as 'first to third organic patterns' or 'first to third intermediate layers'.

The first to third cathodes CE1, CE2, and CE3 (or second-first, second-second, and second-third electrodes) may be located on a corresponding light-emitting pattern among the first to third light-emitting patterns EP1, EP2, and EP3. The first to third cathodes CE1, CE2, and CE3 may be patterned by a tip portion defined in a conductive wall PW, which will be described later. The first to third cathodes CE1, CE2, and CE3 may have conductivity. For example, each of the cathodes CE1, CE2, and CE3 may be formed of various materials, such as a metal, a transparent conductive oxide (TCO), or a conductive polymer material, as long as they have conductivity.

The pixel defining layer PDL may be located on an insulating layer located on the uppermost side of the circuit element layer DP-CL. First to third light-emitting openings OP1-E, OP2-E, and OP3-E may be defined in the pixel defining layer PDL. The first to third light-emitting openings OP1-E, OP2-E, and OP3-E may respectively correspond to the first to third anodes AE1, AE2, and AE3. The pixel defining layer PDL may expose at least a portion of each of the anodes AE1, AE2, and AE3 through the light-emitting openings OP1-E, OP2-E, and OP3-E.

The first light-emitting region PXA-R is defined as a region of the upper surface of the first anode AE1 exposed by the first light-emitting opening OP1-E, the second light-emitting region PXA-G is defined as a region of the upper surface of the second anode AE2 exposed by the second light-emitting opening OP2-E, and the third light-emitting region PXA-B is defined as a region of the upper surface of the third anode AE3 exposed by the third light-emitting opening OP3-B.

The pixel defining layer PDL may be an inorganic insulating film. For example, the pixel defining layer PDL may contain a silicon oxide, a silicon nitride, or a combination thereof. For example, the pixel defining layer PDL may have a two-layer structure in which a silicon oxide layer and a silicon nitride layer are sequentially stacked. However, this is described as an example, and as long as the pixel defining layer PDL can be an inorganic insulating film, the material and structure of the pixel defining layer PDL, whether it is single-layered or multi-layered, may be variously changed, and embodiments according to the present disclosure are not limited to any one embodiment.

Meanwhile, according to some embodiments of the present disclosure, the display panel DP may further include sacrificial patterns SP1, SP2, and SP3. The sacrificial patterns SP1, SP2, and SP3 may include a first sacrificial pattern SP1 located on the upper surface of the first anode AE1, a second sacrificial pattern SP2 located on the upper surface of the second anode AE2, and a third sacrificial pattern SP3 located on the upper surface of the third anode AE3. The sacrificial patterns SP1, SP2, and SP3 may be covered by the pixel defining layer PDL. Each of the sacrificial patterns SP1, SP2, and SP3 exposes at least a portion of a corresponding anode AE1, AE2, or AE3. The sacrificial patterns SP1, SP2, and SP3 may be respectively located at positions that do not overlap the light-emitting openings OP1-E, OP2-E, and OP3-E.

When the display panel DP further includes the sacrificial patterns SP1, SP2, and SP3, the upper surfaces of the anodes AE1, AE2, and AE3 may be spaced apart from the pixel defining layer PDL with the corresponding sacrificial patterns SP1, SP2, and SP3 interposed therebetween on a cross section. Accordingly, it may be possible to protect the anodes AE1, AE2, and AE3 from being damaged in the process of forming the light-emitting openings OP1-E, OP2-E and OP3-E.

The conductive wall PW is located on the pixel defining layer PDL. First to third partition openings OP1-P, OP2-P, and OP3-P may be defined in the conductive wall PW. The first to third partition openings OP1-P, OP2-P, and OP3-P may respectively correspond to the first to third light-emitting openings OP1-E, OP2-E, and OP3-E. Each of the partition openings OP1-P, OP2-P, and OP3-P may expose at least a portion of a corresponding anode AE1, AE2, or AE3.

The conductive wall PW may have an undercut shape on a cross section. The conductive wall PW may include a plurality of layers sequentially stacked, and at least one layer of the plurality of layers may be recessed, compared to adjacent stacked layers. Accordingly, the conductive wall PW may include a tip portion. The light-emitting patterns EP1, EP2, and EP3 may be separated by the tip portion of the conductive wall PW and formed in each of the light-emitting opening OP1-E, OP2-E, and OP3-E and the partition openings OP1-P, OP2-P, OP3-P, and the cathodes CE1, CE2, and CE3 may be separated by the tip portion of the conductive wall PW and formed in each of the partition openings OP1-P, OP2-P, and OP3-P. A detailed description of the shape of the conductive wall PW will be given later.

According to some embodiments, the conductive wall PW may include a first layer L1, a second layer L2 located on the first layer L1, and a third layer L3 located on the second layer L2. The first layer L1 may be located on the pixel defining layer PDL. According to some embodiments of the present disclosure, the conductive wall PW may further include layers located between the first layer L1 and the second layer L2, between the second layer L2 and the third layer L3, or on the third layer, and a detailed description thereof will be given later.

Each of the first and third layers L1 and L3 may contain a metal, a metal oxide, a metal nitride, or a non-metal. For example, the metal may include gold (Au), silver (Ag), aluminum (Al), magnesium (Mg), lithium (Li), molybdenum (Mo), titanium (Ti), copper (Cu), or an alloy. The metal oxide may include a transparent conductive oxide (TCO). The non-metal may include silicon (Si), a silicon oxide ($SiO_x$), a silicon nitride ($SiN_x$), a silicon oxynitride (SiON), or a combination thereof.

The second layer L2 may contain a conductive material. The conductive material may include a metal, a metal nitride, a transparent conductive oxide (TCO), or a combination thereof. For example, the metal may include gold (Au), silver (Ag), aluminum (Al), magnesium (Mg), lithium (Li), molybdenum (Mo), titanium (Ti), copper (Cu), or an alloy. The metal nitride may include a titanium nitride (TiN). The transparent conductive oxide may include an indium tin oxide (ITO), an indium zinc oxide (IZO), a zinc oxide, an indium oxide, an indium gallium oxide, an indium gallium zinc oxide (IGZO) or an aluminum zinc oxide.

According to some embodiments, the cathodes CE1, CE2, and CE3 may come in direct contact with the second layer L2. Although FIG. 5 exemplarily illustrates that the light-emitting patterns EP1, EP2, and EP3 and capping patterns CP1, CP2, and CP3 also come in direct contact with the second layer L2, some of them may not come in contact with the second layer L2.

The conductive wall PW may receive a bias voltage. The cathodes CE1, CE2, and CE3 may be electrically connected to each other and receive a bias voltage as they come in direct contact with the conductive wall PW.

According to some embodiments of the present disclosure, as the cathodes CE1, CE2, and CE3 may have a low contact resistance to the second layer L2 and a common cathode voltage is evenly provided to the light-emitting regions PXA-R, PXA-G, and PXA-B, electrical reliability may be improved and display efficiency may be increased. Further details according to some embodiments are described below.

According to some embodiments of the present disclosure, the plurality of first light-emitting patterns EP1 may be patterned and deposited in a pixel unit by the tip portion defined in the conductive wall PW. That is, the first light-emitting patterns EP1 are commonly formed by using an open mask, but can be easily divided into the pixel unit by the conductive walls PW.

On the other hand, when the first light-emitting patterns are patterned by using a fine metal mask FMM, a support spacer protruding from the conductive wall should be provided to support the fine metal mask. In addition, because the fine metal mask is spaced apart from the base surface, on which patterning is performed, by as much as the height of the barrier rib and the spacer, obtaining high resolution may be limited. In addition, as the fine metal mask comes in contact with the spacer, foreign substances may remain on the spacer after the patterning process of the first light-emitting patterns EP1, or the spacer may be damaged by being stabbed by the fine metal mask. Accordingly, a defective display panel may be formed.

According to some embodiments, because the display panel DP includes the conductive wall PW, physical separation between the light-emitting elements ED1, ED2, and ED3 may be easily achieved. Accordingly, a current leakage or a driving error between adjacent light-emitting regions PXA-R, PXA-G, and PXA-B may be prevented, and it may be possible to drive each of the light-emitting elements ED1, ED2, and ED3 independently.

In particular, by patterning the plurality of first light-emitting patterns EP1 without a mask in contact with the internal configuration in the display region DA (see FIG. 2), the defect rate may be reduced, thus making it possible to provide the display panel DP having improved process reliability. Because patterning may be possible even when a separate support spacer protruding from the conductive wall PW is not provided, the area of the light-emitting regions PXA-R, PXA-G, and PXA-B may be minimized and therefore, it may be possible to provide the display panel DP that easily achieves high resolution.

In addition, in manufacturing the display panel DP having a large area, a process cost may be reduced by omitting the manufacture of a mask having a large area, and by not being affected by a defect occurring in the large-area mask, the display panel DP having improved process reliability may be provided.

According to some embodiments, a thickness t3 (see FIG. 6) of the third layer L3 may be greater than a thickness t1 (see FIG. 6) of the first layer L1. Because the tip portion is formed with the first layer L1 forming the lower portion of the conductive wall PW and the third layer L3 forming the upper portion of the conductive wall PW, the third layer L3 thicker than the first layer L1 may be provided to prevent damage to the conductive wall PW. By providing the third layer L3 thicker than the first layer L1, the third layer L3 forming the tip portion may be prevented from being bent downward or broken due to the dummy patterns DMP1, DMP2, and DMP3 located on the tip portion. According to some embodiments of the present disclosure, a thickness of the third layer L3 may be about 3000 angstroms (Å) or more.

Meanwhile, because the first layer L1 is a component that provides sufficient interfacial adhesion between the conductive wall PW and the pixel defining layer PDL, the total thickness of the conductive wall PW may be reduced by providing the first layer L1 having a comparatively small thickness. According to some embodiments of the present disclosure, the thickness of the first layer L1 may be about 2000 angstroms (Å) or less. Preferably, the thickness of the first layer L1 may be about 1000 angstroms (Å) to about 2000 angstroms (Å).

According to some embodiments of the present disclosure, the display panel DP may further include first to third capping patterns CP1, CP2, and CP3. The first to third capping patterns CP1, CP2, and CP3 may be respectively located in the first to third partition openings OP1-P, OP2-P, and OP3-P and may be respectively located on the first to third cathodes CE1, CE2, and CE3. All of the first to third capping patterns CP1, CP2, and CP3 may be respectively covered by lower encapsulation inorganic layers LIL1, LIL2, and LIL3 to be described later. The first to third capping patterns CP1, CP2, and CP3 may be patterned by the tip portion formed in the conductive wall PW. Meanwhile, according to some embodiments of the present disclosure, the capping patterns CP1, CP2, and CP3 may be omitted.

Dummy patterns DMP1, DMP2, and DMP3 may be located on the conductive wall PW. The dummy patterns DMP1, DMP2, and DMP3 may include a first dummy pattern DMP1, a second dummy pattern DMP2, and a third dummy pattern DMP3.

The first dummy pattern DMP1 may have an integral shape and entirely cover the upper surface of the conductive wall PW. The first dummy pattern DMP1 may cover at least a portion of an inner side surface of the third layer L3 defining a partial region of the first partition opening OP1-P.

In the first dummy pattern DMP1, a first division opening OP1-SP overlapping the first partition opening OP1-P, a first dummy pattern opening OP1-DM overlapping the second partition opening OP2-P, and a second dummy pattern opening OP2-DM overlapping the third partition opening OP3-P may be defined.

The second dummy pattern DMP2 may include a first dummy portion DPP1 and a second dummy portion DPP2.

A portion of the first dummy portion DPP1 may be located on the first dummy pattern DMP1 on the upper surface of the conductive wall PW. The other portion of the first dummy portion DPP1 may cover the inner side surface of the third layer L3 defining a partial region of the second partition opening OP2-P and the inner side surface of the first dummy pattern DMP1 defining the first dummy pattern opening OP1-DM.

A second division opening OP2-SP overlapping the second partition opening OP2-P may be defined in the first dummy portion DPP1. The first dummy portion DPP1 may have a closed-line shape surrounding the second light-emitting region PXA-G on a plane.

The second dummy portion DPP2 may be spaced apart from the first dummy portion DPP1 and located on the first dummy pattern DMP1 on the upper surface of the conductive wall PW. A third dummy pattern opening OP3-DM overlapping the third partition opening OP3-P may be defined in the second dummy portion DPP2. The second dummy portion DPP2 may have a closed-line shape surrounding the third light-emitting region PXA-B on a plane.

A portion of the third dummy pattern DMP3 may be located on the first dummy pattern DMP1 and the second dummy portion DPP2 on the upper surface of the conductive wall PW. The other portion of the third dummy pattern DMP3 may cover the inner side surface of the third layer L3 defining a partial region of the third partition opening OP3-P, the inner side surface of the first dummy pattern DMP1 defining the second dummy pattern opening OP2-DM, and the inner side surface of the second dummy portion DPP2 defining the third dummy pattern opening OP3-DM.

A third division opening OP3-SP overlapping the third partition opening OP3-P may be defined in the third dummy pattern DMP3. The third dummy pattern DMP3 may have a closed-line shape surrounding the third light-emitting region PXA-B on a plane.

The display panel DP according to some embodiments of the present disclosure may further include a dummy inorganic layer LIL-D. The dummy inorganic layer LIL-D may be located between the second dummy portion DPP2 and the third dummy pattern DMP3. A dummy inorganic opening OP3-IL overlapping the third partition opening OP3-P may be defined in the dummy inorganic layer LIL-D. The dummy inorganic layer LIL-D may correspond to a residue separated from a lower encapsulation inorganic layer, which will be described later, in the process of forming the lower encapsulation inorganic layer (for example, a second lower encapsulation inorganic layer LIL2).

Meanwhile, according to some embodiments of the present disclosure, the first dummy pattern DMP1 may be located only in a region adjacent to the first light-emitting region PXA-R, and a plurality of patterned first dummy patterns DMP1 may be provided in each of a plurality of first light-emitting regions PXA-R. In this case, each of the second and third dummy patterns DMP2 and DMP3 may be located directly on the conductive wall PW, and the second dummy portion DPP2 of the second dummy pattern DMP2 may be omitted. That is, the first dummy pattern DMP1 and the second and third dummy patterns DMP2 and DMP3 may be arranged to not overlap each other.

The thin film encapsulation layer TFE may be located on the display element layer DP-OLED. The thin film encapsulation layer TFE may include a first lower encapsulation inorganic layer LIL1, a second lower encapsulation inorganic layer LIL2, a third lower encapsulation inorganic layer LIL3, an encapsulation organic layer OL, and an upper encapsulation inorganic layer UIL.

The first lower encapsulation inorganic layer LIL1 may be formed on the conductive wall PW and the first cathode CE1 and located inside the first partition opening OP1-P. The first lower encapsulation inorganic layer LIL1 may cover the first dummy pattern DMP1 and the first cathode CE1 (or the first capping pattern CP1). According to some embodiments of the present disclosure, the first lower encapsulation inorganic layer LIL1 may come in contact with the inner side surface of the second layer L2 defining a partial region of the first partition opening OP1-P.

The first lower encapsulation inorganic layer LIL1 may entirely cover the upper surface of the first dummy pattern DMP1. The first lower encapsulation inorganic layer LIL1 may have an integral shape. In the first lower encapsulation inorganic layer LIL1, a first encapsulation opening OP1-IL overlapping the second partition opening OP2-P and a second encapsulation opening OP2-IL overlapping the third partition opening OP3-P may be defined.

The second lower encapsulation inorganic layer LIL2 may be formed on the conductive wall PW and the second cathode CE2 and located inside the second partition opening OP2-P. According to some embodiments of the present disclosure, the second lower encapsulation inorganic layer LIL2 may cover the first dummy portion DPP1 and the second cathode CE2 (or the second capping pattern CP2). The second lower encapsulation inorganic layer LIL2 may overlap the first lower encapsulation inorganic layer LIL1 on the conductive wall PW. According to some embodiments of the present disclosure, the second lower encapsulation inorganic layer LIL2 may come in contact with the inner side surface of the second layer L2 defining a partial region of the second partition opening OP2-P.

The third lower encapsulation inorganic layer LIL3 may be formed on the conductive wall PW and the third cathode CE3 and located inside the third partition opening OP3-P. According to some embodiments of the present disclosure, the third lower encapsulation inorganic layer LIL3 may cover the third dummy pattern DMP3 and the third cathode CE3 (or the third capping pattern CP3). The third lower encapsulation inorganic layer LIL3 may overlap the first lower encapsulation inorganic layer LIL1 and a dummy inorganic layer LIL-D on the conductive wall PW.

According to some embodiments, each of the first to third lower encapsulation inorganic layers LIL1, LIL2, and LIL3 may also come in contact with the lower side of the third layer L3 exposed from the second layer L2. The lower encapsulation inorganic layers LIL1, LIL2, and LIL3 may entirely cover the exposed portion of the conductive wall PW.

The encapsulation organic layer OL may cover the first to third lower encapsulation inorganic layers LIL1, LIL2, and LIL3 and provide a flat upper surface. The upper encapsulation inorganic layer UIL may be located on the encapsulation organic layer OL.

The first to third lower encapsulation inorganic layers LIL1, LIL2, and LIL3 and the upper encapsulation inorganic layer UIL may protect the display element layer DP-OLED from moisture/oxygen, and the encapsulation organic layer OL may protect the display element layer DP-OLED from foreign substances such as dust particles.

Figure 6:
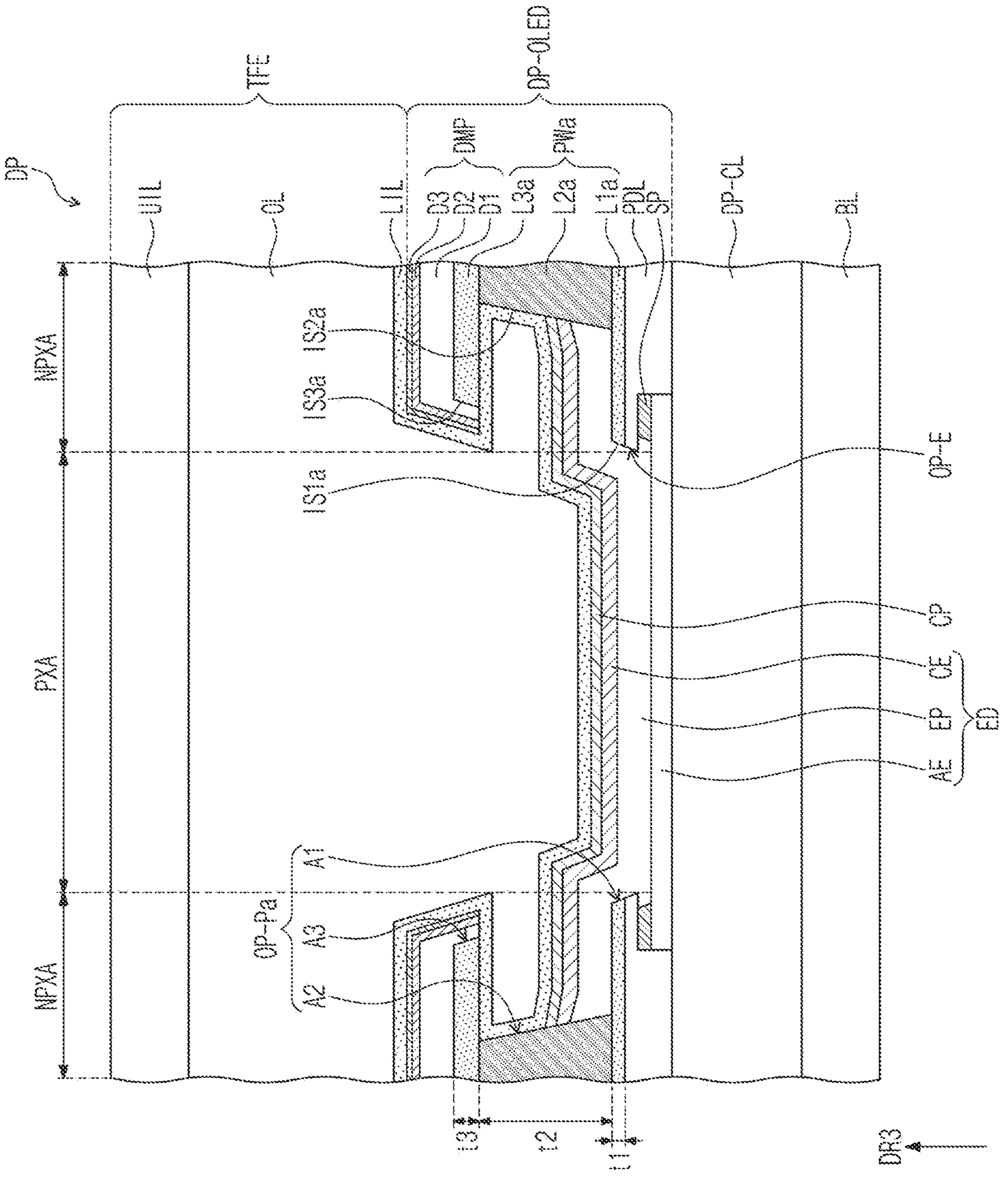
FIG. 6 is an enlarged cross-sectional view of one region of the display panel according to some embodiments of the present disclosure.

FIG. 6 is an enlarged cross-sectional view of one region of the display panel according to some embodiments of the present disclosure. FIG. 6 is an enlarged cross-sectional view of one light-emitting region PXA and a peripheral region NPXA adjacent to the light-emitting region PXA of the display panel DP. According to some embodiments of the present disclosure, the one light-emitting region PXA of FIG. 6 may correspond to the first light-emitting region PXA-R of FIG. 5. Meanwhile, without being limited thereto, according to some embodiments of the present disclosure, the one light-emitting region PXA of FIG. 6 may correspond to the second and third light-emitting regions PXA-G and PXA-B. The description of the one light-emitting region PXA to be described later may be applied to all of the first to third light-emitting regions PXA-R, PXA-G, and PXA-B.

Referring to FIG. 6, in the display panel DP according to some embodiments of the present disclosure, the display element layer DP-OLED may include a light-emitting element ED, a pixel defining layer PDL, a conductive wall PWa, a capping pattern CP, and a dummy pattern DMP, wherein the light-emitting element ED may include an anode AE, a light-emitting pattern EP, and a cathode CE. The thin film encapsulation layer TFE may include a lower encapsulation inorganic layer LIL, an encapsulation organic layer OL, and an upper encapsulation inorganic layer UIL.

The conductive wall PWa may include a first layer L1*a*, a second layer L2*a*, and a third layer L3*a* which are sequentially stacked on the pixel defining layer PDL in a thickness direction. A partition opening OP-Pa defined in the conductive wall PWa may include a first region A1, a second region A2, and a third region A3 which are sequentially arranged in the thickness direction.

The first layer L1*a* may include a first inner side surface IS1*a* defining the first region A1 of the partition opening OP-Pa, the second layer L2*a* may include a second inner side surface IS2*a* defining the second region A2 of the partition opening OP-Pa, and the third layer L3*a* may include a third inner side surface IS3*a* defining the third region A3 of the partition opening OP-Pa.

According to some embodiments, the second inner side surface IS2*a* may be recessed relatively more inward than the first inner side surface IS1*a* and the third inner side surface IS3*a* with respect to the light-emitting region PXA. That is, the second inner side surface IS2*a* may be formed by being undercut with respect to the third inner side surface IS3*a*. In addition, a portion of the third inner side surface IS3*a* protruding from the second inner side surface IS2*a* toward the light-emitting region PXA may form a tip portion. Accordingly, the light-emitting pattern EP and the cathode CE may be physically separated by the third layer L3*a* forming the tip portion and formed in a corresponding partition opening OP-Pa.

According to some embodiments of the present disclosure, each of the first to third inner side surfaces IS1*a*, IS2*a*, and IS3*a* may be inclined with respect to the upper surface of the anode AE. For example, the interior angle formed by each of the first to third inner side surfaces IS1*a*, IS2*a*, and IS3*a* with respect to the upper surface of the anode AE may be an acute angle. Meanwhile, the shapes of the first to third inner side surfaces IS1*a*, IS2*a*, and IS3*a* may vary depending on the materials and/or etching process conditions of each layer.

The second layer L2*a* may have a higher electrical conductivity than the first and third layers L1*a* and L3*a*. A thickness t2 of the second layer L2*a* may be relatively greater than a thickness t1 of the first layer L1*a* and a thickness t3 of the third layer L3*a*. Because the second layer L2*a* comes in direct contact with the cathode CE and has a relatively high electrical conductivity and a relatively large thickness, the contact resistance of the cathode CE may be reduced, and the occurrence of poor contact with the cathode CE may be reduced.

According to some embodiments, each of the first to third layers L1*a*, L2*a*, and L3*a* may contain a metal. For example, the second layer L2*a* may contain copper (Cu). In this case, each of the first layer L1*a* and the third layer L3*a* may contain titanium (Ti).

According to a comparative embodiment in which the second layer L2*a* contains aluminum (Al), an oxide film may be formed on the second inner side surface IS2*a*, and the interface of the second layer L2*a* may have insulating properties due to the oxide film. In this case, as the cathode CE comes in direct contact with the oxide film, the contact resistance of the cathode CE may be high. On the other hand, according to some embodiments, as the second layer L2*a* contains copper (Cu) having oxidation resistance, the cathode CE may come in contact with the interface of the second layer L2*a* on which an oxide film is not formed, thus reducing the contact resistance of the cathode CE.

According to some embodiments of the present disclosure, the cathode CE may be made of silver (Ag) or an alloy of silver (Ag). Because the second layer L2*a* contains copper (Cu), which is not only an element of the same group as silver (Ag), but also a material having chemical properties similar to the constituent material of the cathode CE, it may be possible to reduce the contact resistance of the cathode CE.

The dummy pattern DMP according to some embodiments of the present disclosure may include a first layer D1, a second layer D2, and a third layer D3.

The first layer D1 may be formed through the same process as the light-emitting pattern EP and therefore may have the same structure as the light-emitting pattern EP and contain the same material as the light-emitting pattern EP. When the light-emitting pattern EP is commonly formed, the first layer D1 may be separated from the light-emitting pattern EP by the tip portion of the conductive wall PWa. An end of the first layer D1 facing the partition opening OP-Pa may be spaced apart from the light-emitting pattern EP.

The second layer D2 may be formed through the same process as the cathode CE and therefore may have the same structure as the cathode CE and contain the same material as the cathode CE. When the cathode CE is commonly formed, the second layer D2 may be separated from the cathode CE by the tip portion of the conductive wall PWa. An end of the second layer D2 facing the partition opening OP-Pa may be spaced apart from the cathode CE.

The third layer D3 may be formed through the same process as the capping pattern CP and therefore may have the same structure as the capping pattern CP and contain the same material as the capping pattern CP. When the capping pattern CP is commonly formed, the third layer D3 may be separated from the capping pattern CP by the tip portion of the conductive wall PWa. An end of the third layer D3 facing the partition opening OP-Pa may be spaced apart from the capping pattern CP. Meanwhile, when the capping pattern CP is omitted, the third layer D3 may also be omitted.

FIGS. 7A to 7G are cross-sectional views illustrating steps of a method of manufacturing the display panel according to some embodiments of the present disclosure.

Figure 7A:
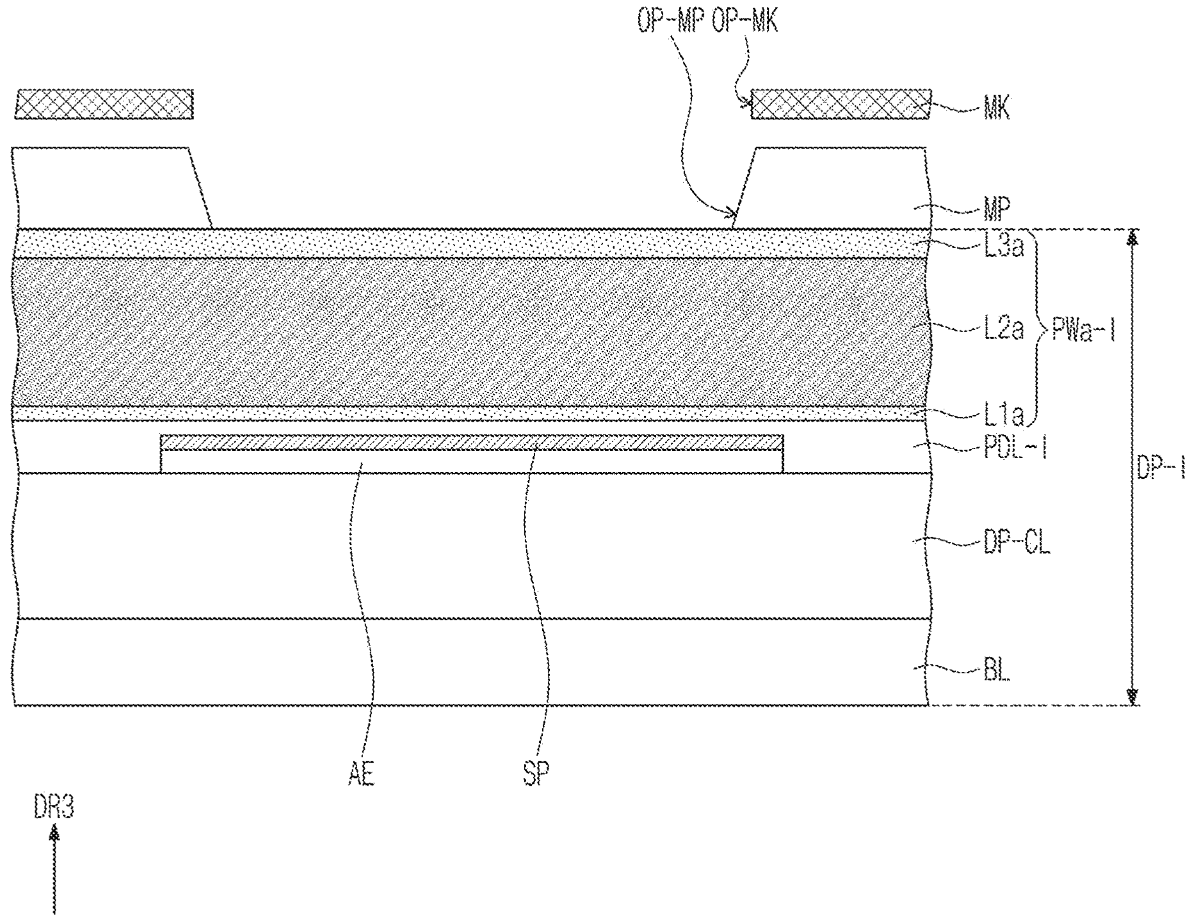
FIGS. 7A to 7G are cross-sectional views illustrating steps of a method of manufacturing the display panel according to some embodiments of the present disclosure.

First of all, referring to FIG. 7A, the method of manufacturing the display panel according to some embodiments may include forming a mask pattern MP on a preliminary display panel DP-I.

The preliminary display panel DP-I provided in this embodiment may include a base layer BL, a circuit element layer DP-CL, an anode AE, a sacrificial pattern SP, a preliminary pixel defining layer PDL-I, and a preliminary conductive wall layer PWa-I.

The circuit element layer DP-CL may be formed through a typical circuit element manufacturing process in which an insulating layer, a semiconductor layer, and a conductive layer are formed by a method such as coating or deposition, and then the insulating layer, the semiconductor layer, and the conductive layer are selectively patterned through photolithography and etching processes to form a semiconductor pattern, a conductive pattern, a signal line, and the like.

The anode AE and the sacrificial pattern SP may be formed through a same patterning process. The preliminary pixel defining layer PDL-I may cover both the anode AE and the sacrificial pattern SP.

The preliminary conductive wall layer PWa-I may include a first layer L1*a*, a second layer L2*a* located on the first layer L1*a*, and a third layer L3*a* located on the second layer L2*a*. The second layer L2*a* may have a greater thickness than the first layer L1*a* and the third layer L3*a*, and the third layer L3*a* may have a greater thickness than the first layer L1*a*.

According to some embodiments, all of the first to third layers L1*a*, L2*a*, and L3*a* may contain a metal material. For example, the second layer L2*a* may contain copper (Cu), and the first and third layers L1*a* and L3*a* may contain titanium (Ti). The mask pattern MP may be formed by forming a photoresist layer on the preliminary conductive wall layer PWa-I and then patterning the photoresist layer with the use of a photo mask MK having a mask opening OP-MK. A photo opening OP-MP corresponding to the mask opening OP-MK may be formed in the mask pattern MP. The mask opening OP-MK may overlap the anode AE.

Figure 7B:
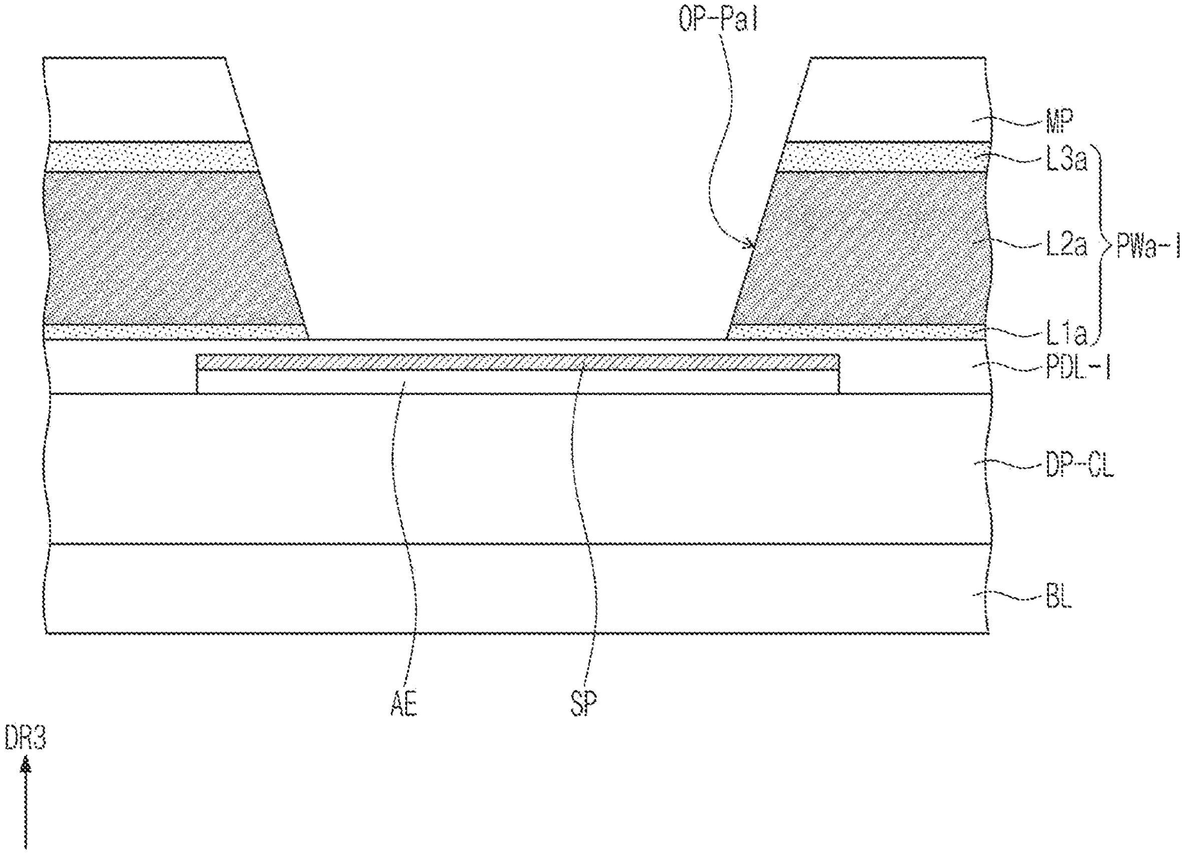
Figure 7C:
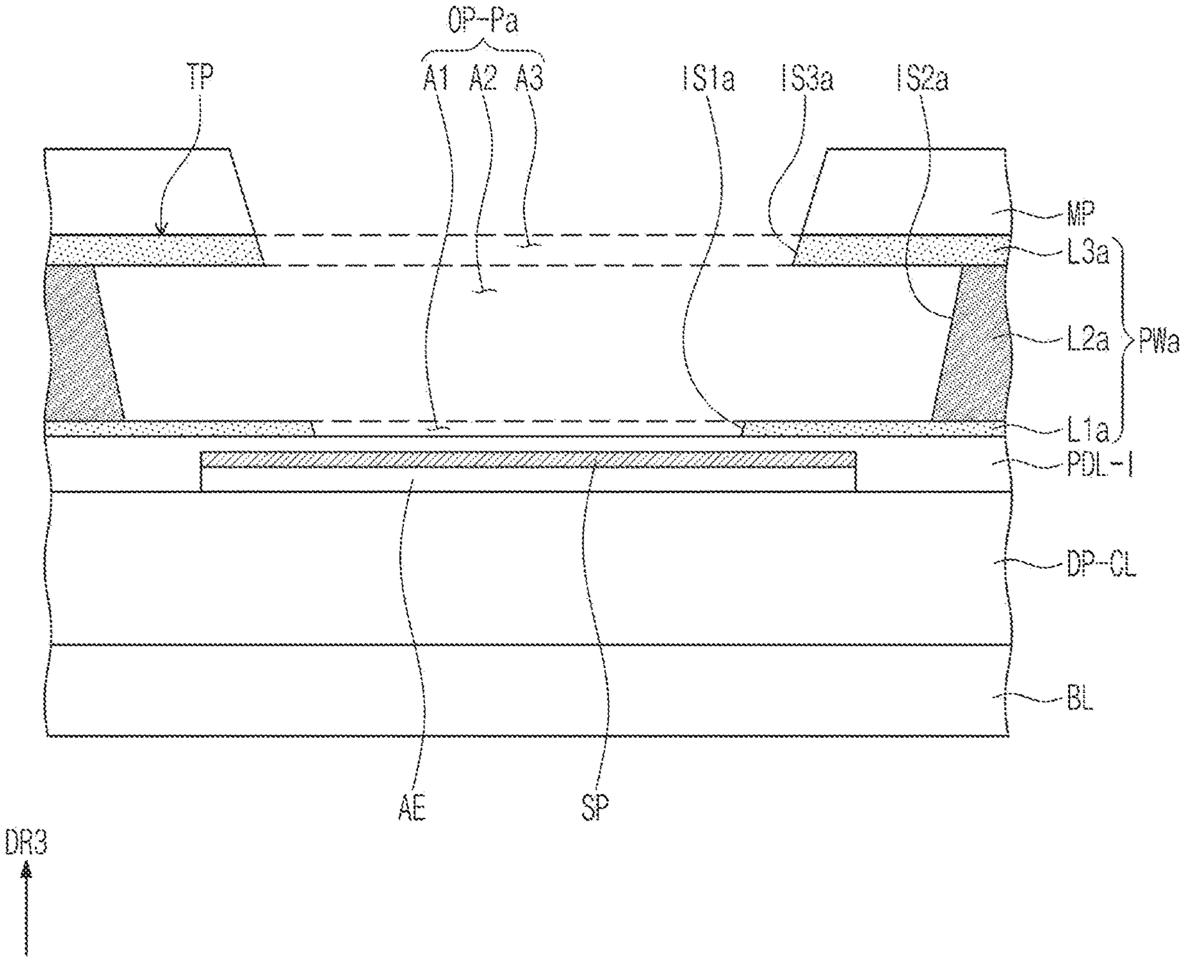

Hereafter, referring to FIGS. 7B and 7C, the method of manufacturing the display panel according to some embodiments may include forming a conductive wall PWa, which has the partition opening OP-Pa defined therein, from the preliminary conductive wall layer PWa-I through a first etching process.

As illustrated in FIG. 7B, the first etching process according to some embodiments may include forming a preliminary partition opening OP-PaI in the preliminary conductive wall layer PWa-I by performing a first wet etching process on the first to third layers L1*a*, L2*a*, and L3*a* with the use of the mask pattern MP as a mask. The first wet etching process may be performed in an etching environment in which the etching selectivities of the first to third layers L1*a*, L2*a*, and L3*a* are substantially the same as each other. Accordingly, the first inner side surface of the first layer L1*a*, the second inner side surface of the second layer L2*a*, and the third inner side surface of the third layer L3*a*, which define the preliminary partition opening OP-PaI, may be aligned with each other.

Hereafter, as illustrated in FIG. 7C, the first etching process according to some embodiments may include forming the conductive wall PWa, in which the partition opening OP-Pa is formed, from the preliminary conductive wall layer PWa-I, which has the preliminary partition opening OP-PaI defined therein, by performing a second wet etching process on the first to third layers L1*a*, L2*a*, and L3*a* with the use of the mask pattern MP as a mask.

The partition opening OP-Pa may include a first region A1, a second region A2, and a third region A3. The first region A1 may correspond to a region of the partition opening OP-Pa defined by the first inner side surface IS1*a* of the first layer L1*a*, the second region A2 may correspond to a region of the partition opening OP-Pa defined by the second inner side surface IS2*a* of the second layer L2*a*, and the third region A3 may correspond to a region of the partition opening OP-Pa defined by the third inner side surface IS3*a* of the third layer L3*a*.

The second wet etching process may be performed in an environment in which the etching selectivity between the second layer L2*a* and the remaining layers L1*a* and L3*a* is high. Accordingly, the first to third inner side surfaces IS1*a*, IS2*a*, and IS3*a* may be changed by the second wet etching process, and the conductive wall PWa may have an undercut shape on a cross section. Specifically, the second inner side surface IS2*a* may be formed to be recessed more inward than the first and third inner side surfaces IS1*a* and IS3*a*. Accordingly, the width of the second region A2 of the partition opening OP-Pa formed in the second layer L2*a* may be greater than the width of the first region A1 formed in the first layer L1*a* and the width of the third region A3 formed in the third layer L3*a*. The first and third inner side surfaces IS1*a* and IS3*a* may protrude from the second inner side surface **152*a*** toward the center of the partition opening OP-Pa, and a portion of the third layer L3*a* protruding from the second layer L2*a* may form a tip portion TP.

Meanwhile, the etching process for forming the partition opening OP-Pa is not limited thereto and may vary depending on the structure of the conductive wall and the materials of each layer. According to some embodiments of the present disclosure, the partition opening may be formed through different etching methods for each embodiment in which the structures/materials of the conductive wall are different from each other, and a description thereof will be given below, focusing on differences in each embodiment.

Figure 7D:
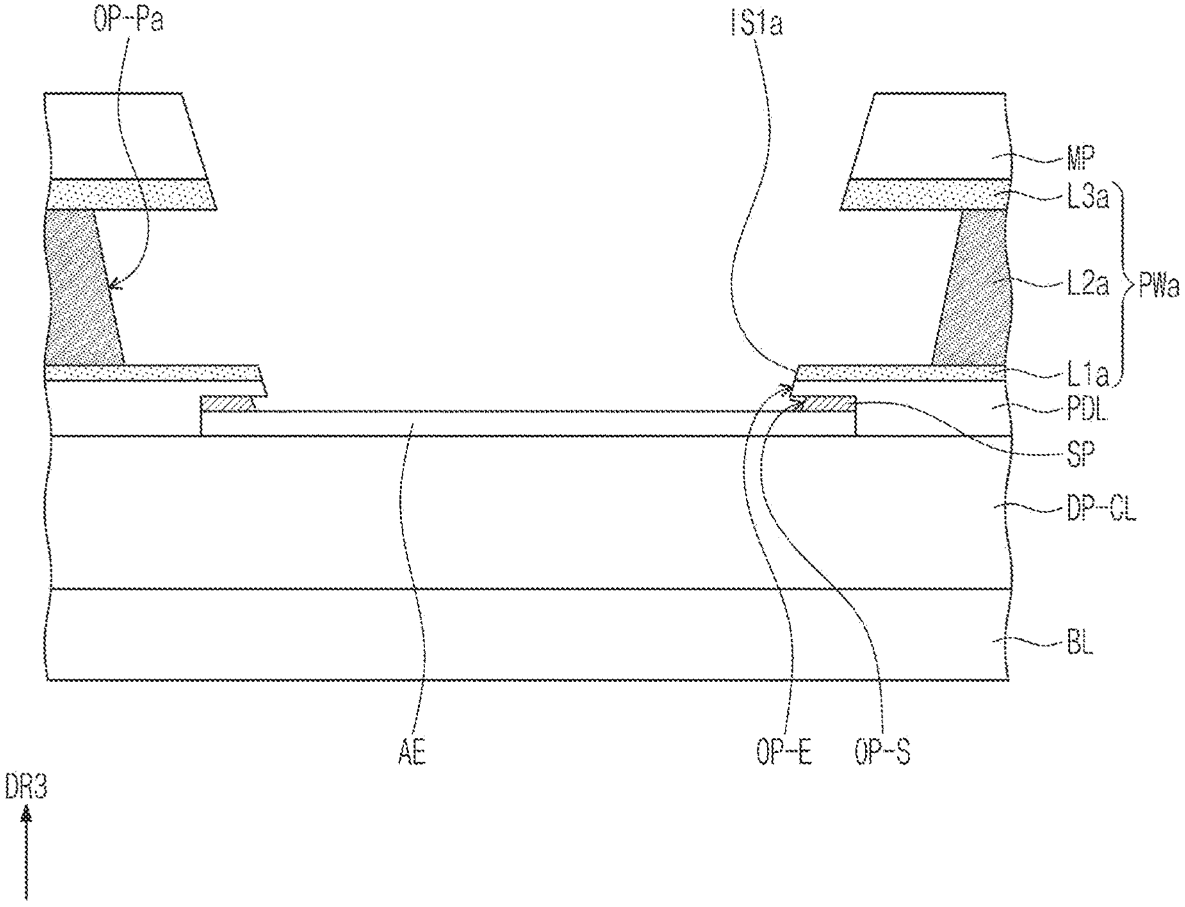

Referring to FIG. 7D, the method of manufacturing the display panel according to some embodiments may include forming a pixel defining layer PDL, which has a light-emitting opening OP-E defined therein, from a preliminary pixel defining layer PDL-I (see FIG. 7C) through a second etching process. The second etching process according to some embodiments may be performed by a dry etching method with the use of the first layer L1*a* of the conductive wall PWa as a mask, and the inner side surface of the pixel defining layer PDL defining the light-emitting opening OP-E may be aligned with the first inner side surface IS1*a*.

As illustrated in FIG. 7D, the sacrificial pattern SP may be patterned so as to expose at least a portion of the anode AE. The sacrificial pattern SP may be patterned through an etching process separate from the second etching process or through the same process as the second etching process. The separate etching process may be performed by a method different from the second etching process, for example, by a wet etching method.

A sacrificial opening OP-S corresponding to the light-emitting opening OP-E may be defined in the sacrificial pattern SP, and an inner side surface of the sacrificial pattern SP defining the sacrificial opening OP-S may be formed to be recessed more inward than the inner side surface of the pixel defining layer PDL defining the light-emitting opening OP-E. Meanwhile, this is illustrated as an example, and the inner side surface of the sacrificial pattern SP may be aligned with the inner side surface of the pixel defining layer PDL, and embodiments according to the present disclosure are not limited to any one embodiment.

The patterning process of the sacrificial pattern SP may be performed in an environment in which the etching selectivity between the sacrificial pattern SP and the anode AE is high, and through this, it may be possible to prevent the anode AE from being etched together. That is, by arranging the sacrificial pattern SP, which has a higher etch rate than the anode AE, between the pixel defining layer PDL and the anode AE, it may be possible to prevent the anode AE from being etched together and damaged during an etching process.

Figure 7E:
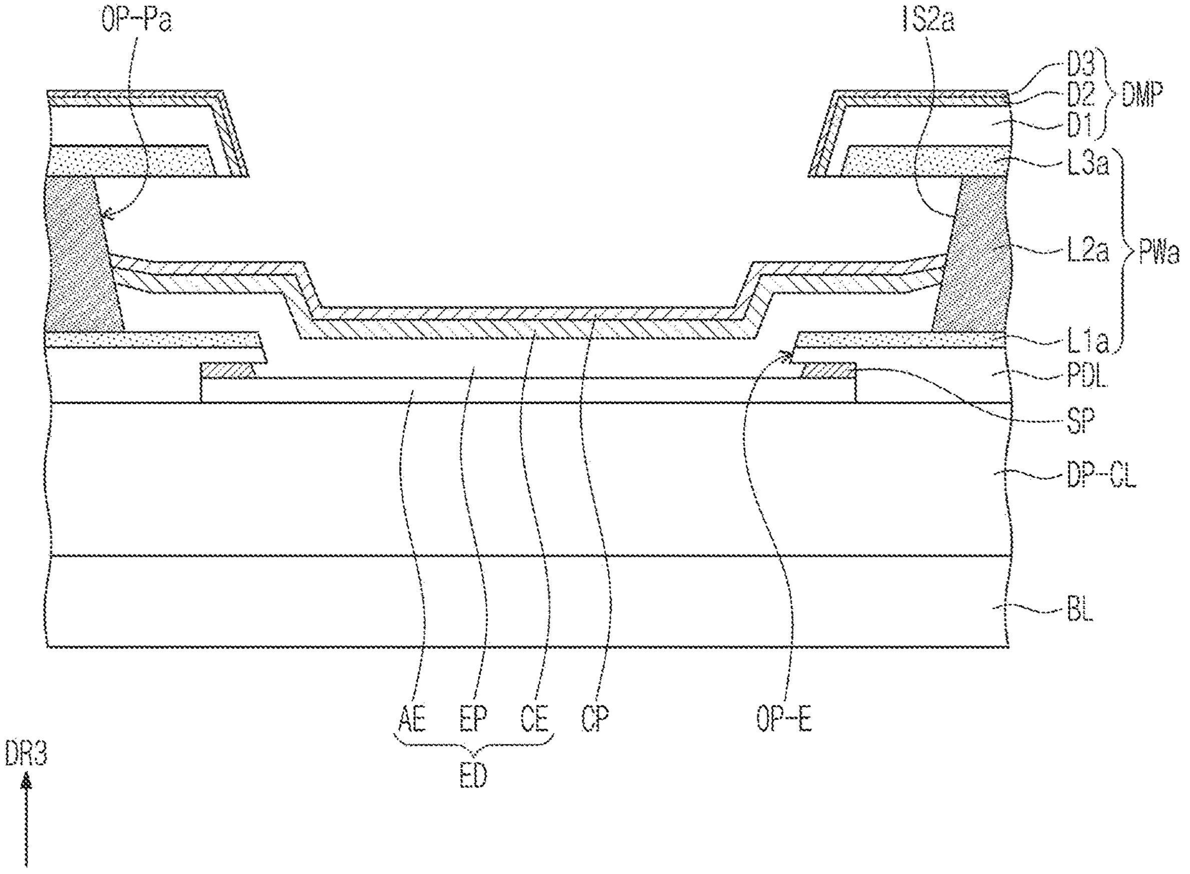

Referring to FIG. 7E, the method of manufacturing the display panel according to some embodiments may include removing a mask pattern MP (see FIG. 7D) and forming a light-emitting element ED. The forming of the light-emitting element ED may include forming the light-emitting pattern EP and forming the cathode CE. According to some embodiments of the present disclosure, the forming of the light-emitting pattern EP may be performed through a thermal evaporation process, and the forming of the cathode CE may be performed through a sputtering process, but the embodiments of the present disclosure are not limited thereto.

The light-emitting pattern EP and the cathode CE may be separated by the tip portion TP (refer to FIG. 7C) formed in the conductive wall PWa and located in the partition opening OP-Pa. In the forming of the light-emitting element ED, a dummy pattern DMP may be formed together. The cathode CE is provided at a higher incident angle than the light-emitting pattern EP so that the cathode CE may be formed to come in contact with the second inner side surface IS2*a* defining the second region A2 of the partition opening OP-Pa.

Meanwhile, the method of manufacturing the display panel according to some embodiments may further include forming a capping pattern CP. The capping pattern CP may be formed through a deposition process, and the capping pattern CP may be separated by the tip portion TP (refer to FIG. 7C) formed in the conductive wall PWa and located in the partition opening OP-Pa.

Figure 7F:
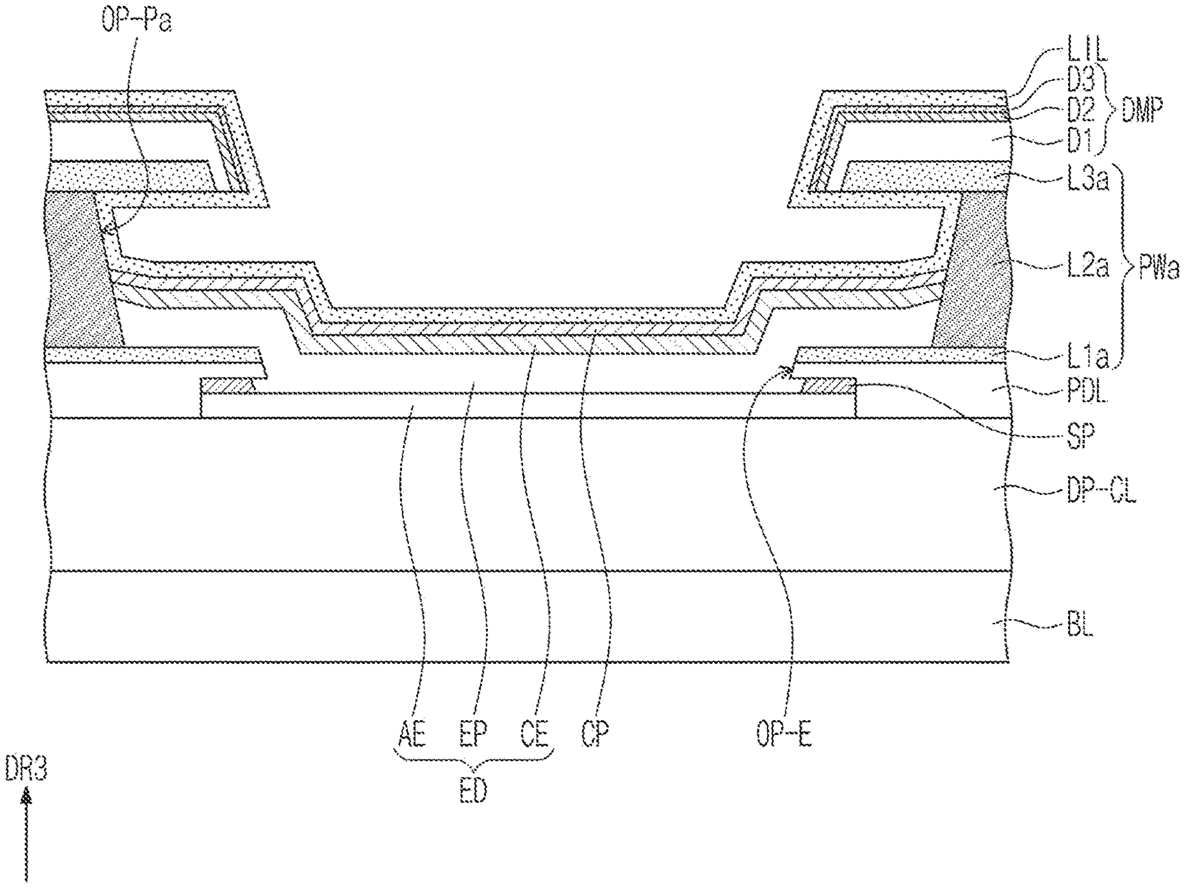

Referring to FIG. 7F, the method of manufacturing the display panel according to some embodiments may include forming a lower encapsulation inorganic layer LIL. The lower encapsulation inorganic layer LIL may be formed through a chemical vapor deposition (CVD) process. The lower encapsulation inorganic layer LIL may be formed on the conductive wall PWa and the cathode CE and may be formed inside the partition opening OP-Pa.

Figure 7G:
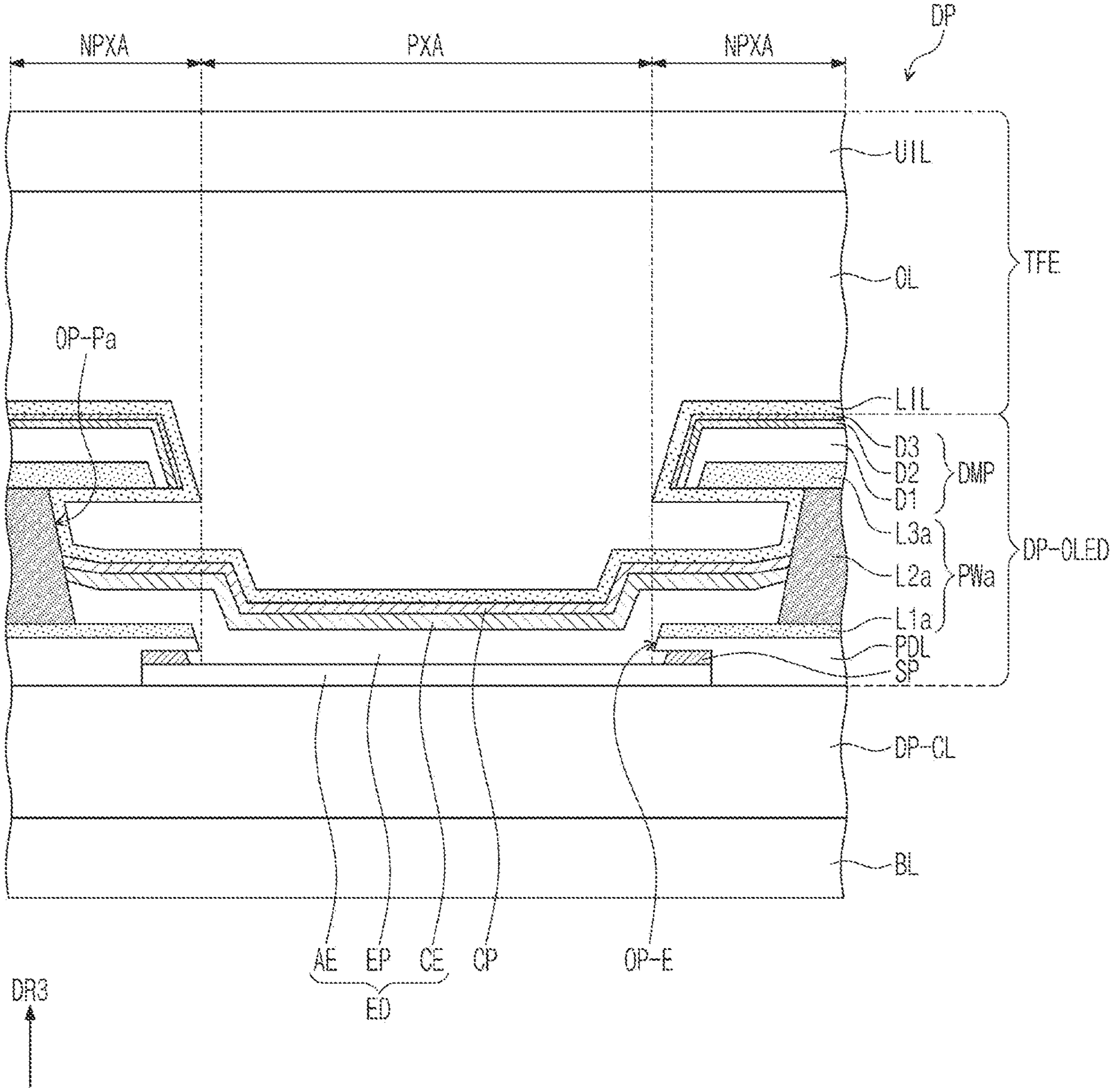

Referring to FIG. 7G, the method of manufacturing the display panel according to some embodiments may include forming an encapsulation organic layer OL and an upper encapsulation inorganic layer UIL to complete the display panel DP. The encapsulation organic layer OL may be formed by applying an organic material by an inkjet method, but the embodiments of the present disclosure are not limited thereto. The encapsulation organic layer OL provides a planarized upper surface. Hereafter, the upper encapsulation inorganic layer UIL may be formed by depositing an inorganic material. Through this, the display panel DP including a base layer BL, a circuit element layer DP-CL, a display element layer DP-OLED, and a thin film encapsulation layer TFE may be formed.

Between the forming of the lower encapsulation inorganic layer LIL and the completing of the display panel DP, forming a partition opening and a light-emitting opening corresponding to a light-emitting region of a different color in the conductive wall PWa and the pixel defining layer PDL, forming light-emitting elements configured to provide light of different colors, and forming a lower encapsulation inorganic layer configured to cover the light-emitting elements configured to provide light of different colors may be further performed. In this process, as described above in FIG. 5. the second dummy pattern DMP2, the third dummy pattern DMP3, the second lower encapsulation inorganic layer LIL2, the third lower encapsulation inorganic layer LIL3, and the dummy inorganic layer LIL-D located above the first dummy pattern DMP1 may be further formed.

Figure 8:
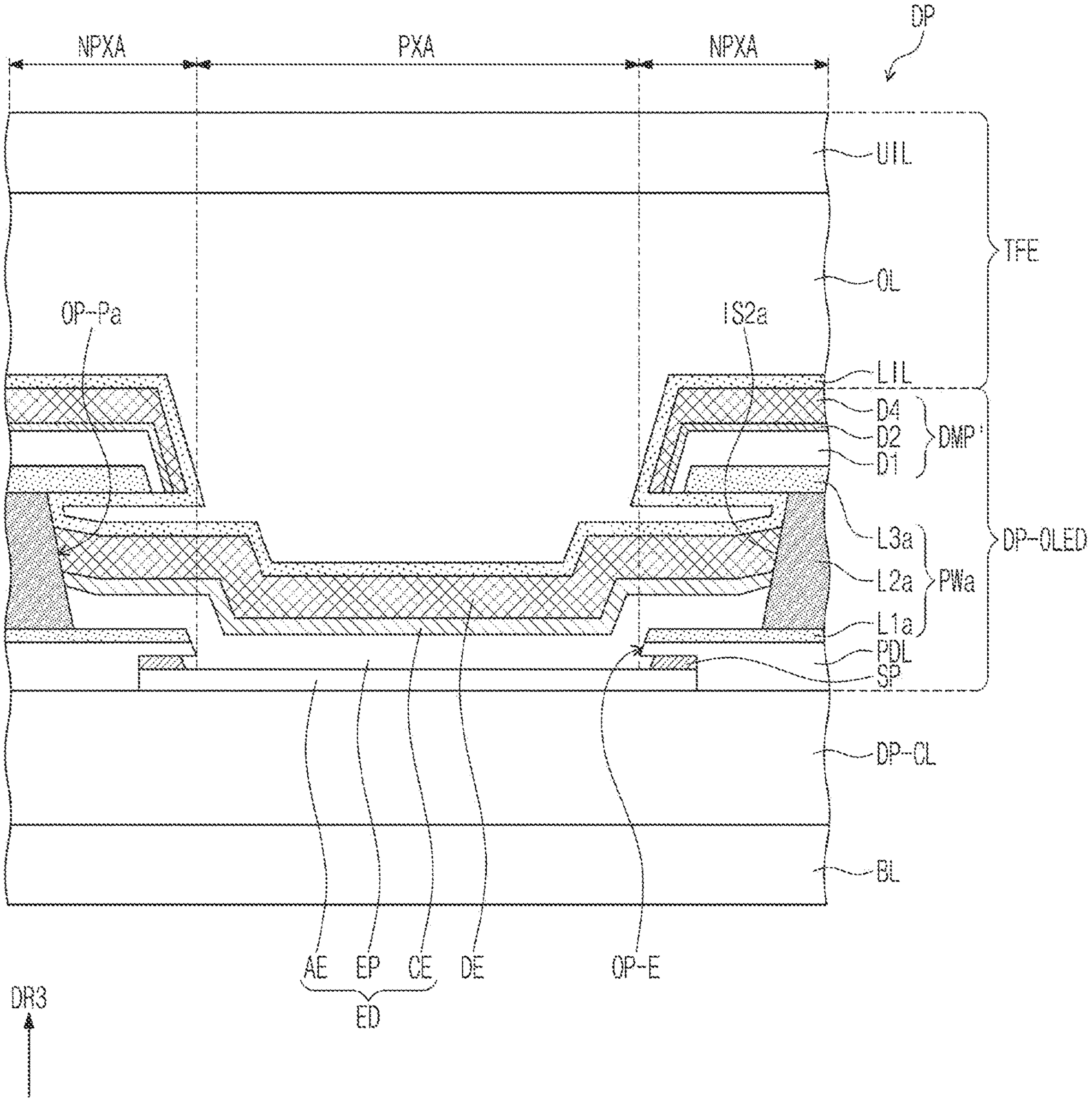
FIG. 8 is an enlarged cross-sectional view of one region of the display panel according to some embodiments of the present disclosure.

FIG. 8 is an enlarged cross-sectional view of one region of the display panel according to some embodiments of the present disclosure.

Referring to FIG. 8, in the display panel DP according to some embodiments, the conductive wall PWa may include a first layer L1*a*, a second layer L2*a*, and a third layer L3*a*. According to some embodiments, each of the first to third layers L1*a*, L2*a*, and L3*a* may contain a metal material. For example, the second layer L2*a* may contain copper (Cu), and each of the first layer L1*a* and the third layer L3*a* may contain titanium (Ti).

According to some embodiments, the display panel DP may further include an auxiliary electrode DE located on the cathode CE. The auxiliary electrode DE may have a greater thickness than the cathode CE. For example, the thickness of the auxiliary electrode DE may be 10 times or more the thickness of the cathode CE. Accordingly, an area, in which the auxiliary electrode DE comes in contact with the second inner side surface IS2*a* of the second layer L2*a*, may be larger than an area, in which the cathode CE comes in contact with the second inner side surface IS2*a*. As the auxiliary electrode DE electrically connected to the cathode CE secures a sufficient contact area with the second inner side surface IS2*a*, the contact resistance between the conductive wall PWa and the electrodes may be reduced.

According to some embodiments, the auxiliary electrode DE may contain a transparent conductive oxide (TCO). According to some embodiments of the present disclosure, the auxiliary electrode DE may contain an indium tin oxide (ITO). When the auxiliary electrode DE contains the indium tin oxide (ITO), the contact resistance of the second layer L2*a* containing copper (Cu) may be reduced.

When the minimum width of the second region A2 (see FIG. 6) of the partition opening OP-Pa on a plane is provided as 3.5 micrometers, according to a comparative embodiment in which the second layer L2*a* contains aluminum (Al), the contact resistance of an electrode containing the indium tin oxide (ITO) may be about 100000 ohms (Ω), while, according to some embodiments in which the second layer L2*a* contains copper (Cu), the contact resistance of an electrode containing the indium tin oxide (ITO) may be about 0.3 ohm (Ω). Accordingly, in the conductive wall PWa including copper (Cu), it can be confirmed that the contact resistance of the auxiliary electrode DE is at a low level.

According to some embodiments, a dummy pattern DMP' may further include a fourth layer D4. The fourth layer D4 may be formed through the same process as the auxiliary electrode DE and therefore may have the same structure as the auxiliary electrode DE and contain the same material as the auxiliary electrode DE. The fourth layer D4 may correspond to a residue separated from the auxiliary electrode DE by the tip portion of the conductive wall PWa when the auxiliary electrode DE is commonly formed.

Meanwhile, according to some embodiments of the present disclosure, the display panel DP may further include the capping pattern CP described above with reference to FIG. 6. The capping pattern CP (see FIG. 6) may be located on the auxiliary electrode DE. In this case, the dummy pattern DMP' may further include a third layer D3 (see FIG. 6) located on the fourth layer D4.

Figure 9:
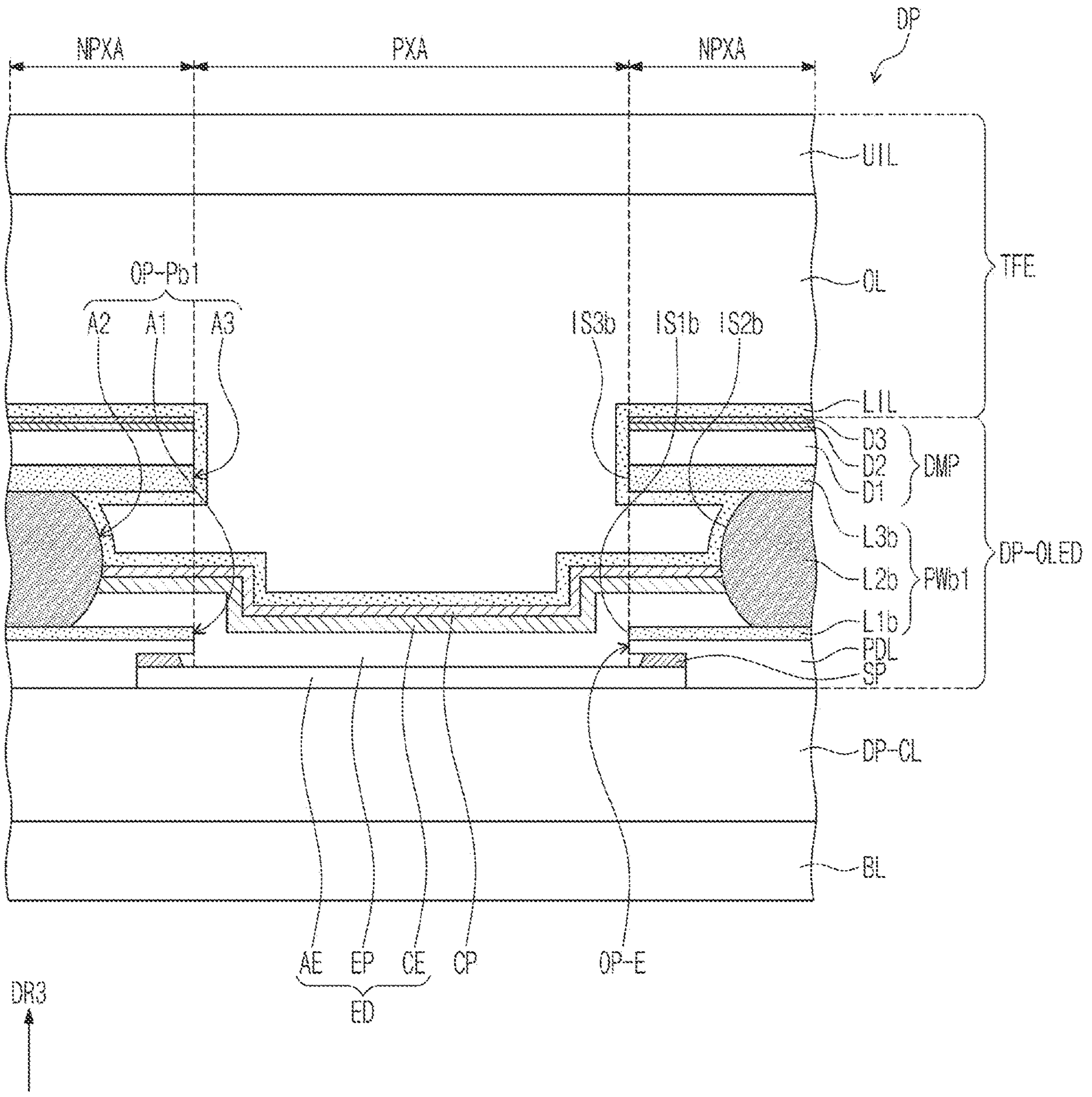
FIG. 9 is an enlarged cross-sectional view of one region of the display panel according to some embodiments of the present disclosure.
Figure 10A:
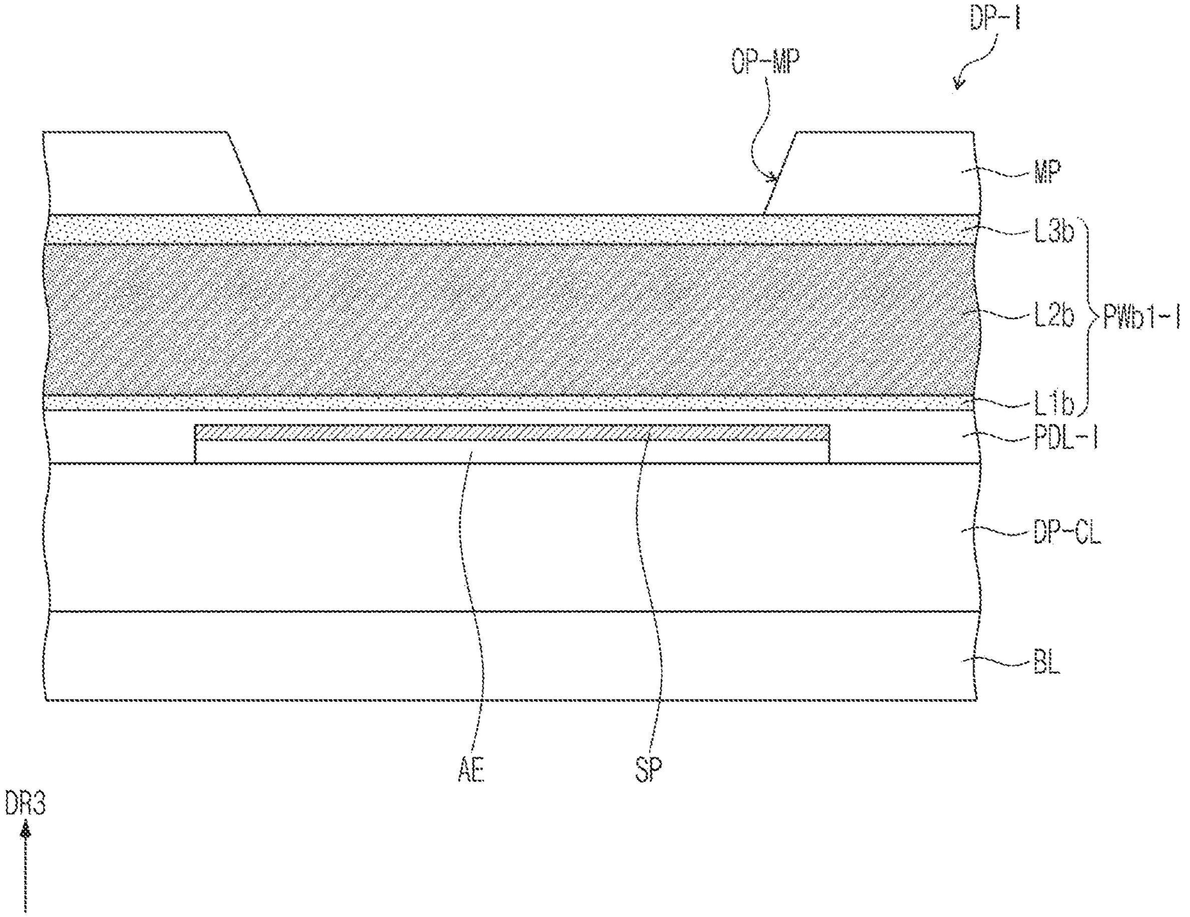
FIGS. 10A to 10C are cross-sectional views illustrating steps of a method of manufacturing a display panel according to some embodiments of the present disclosure.
Figure 10B:
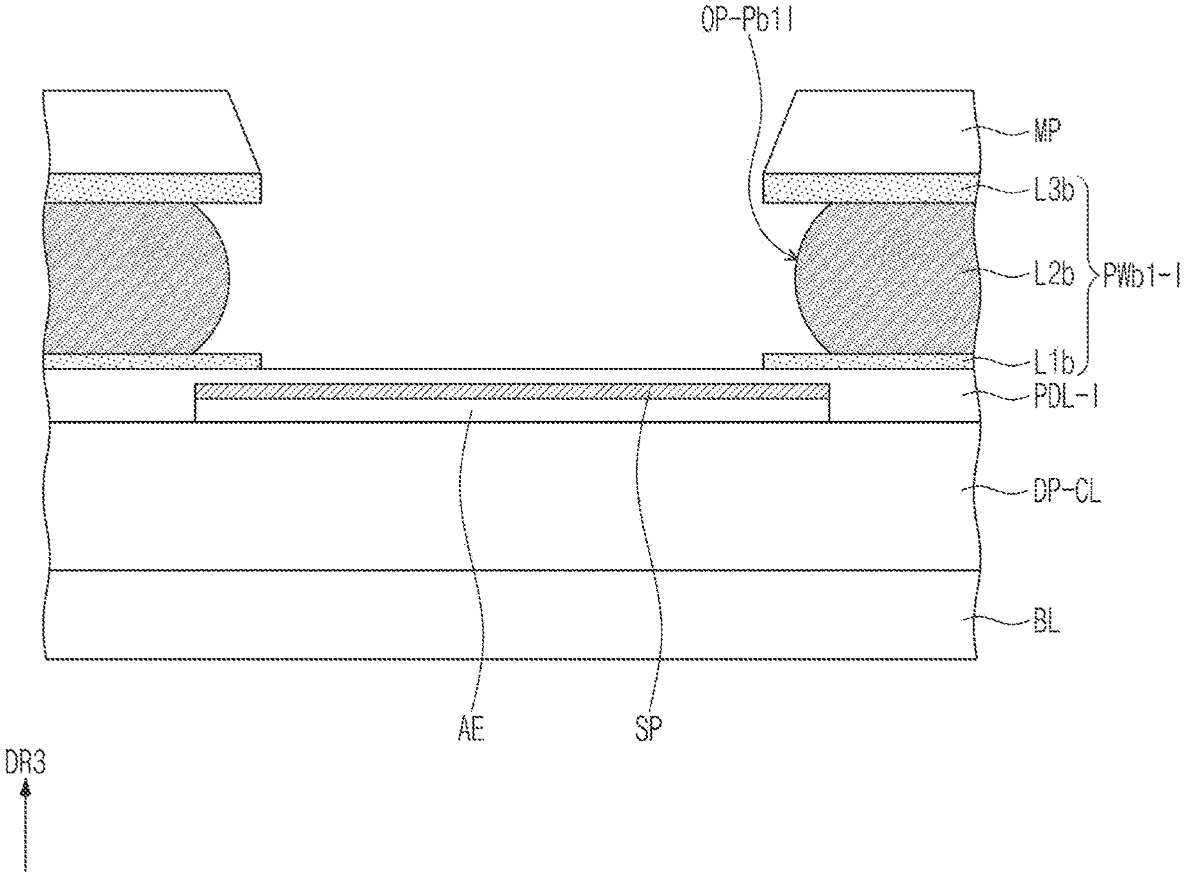
Figure 10C:
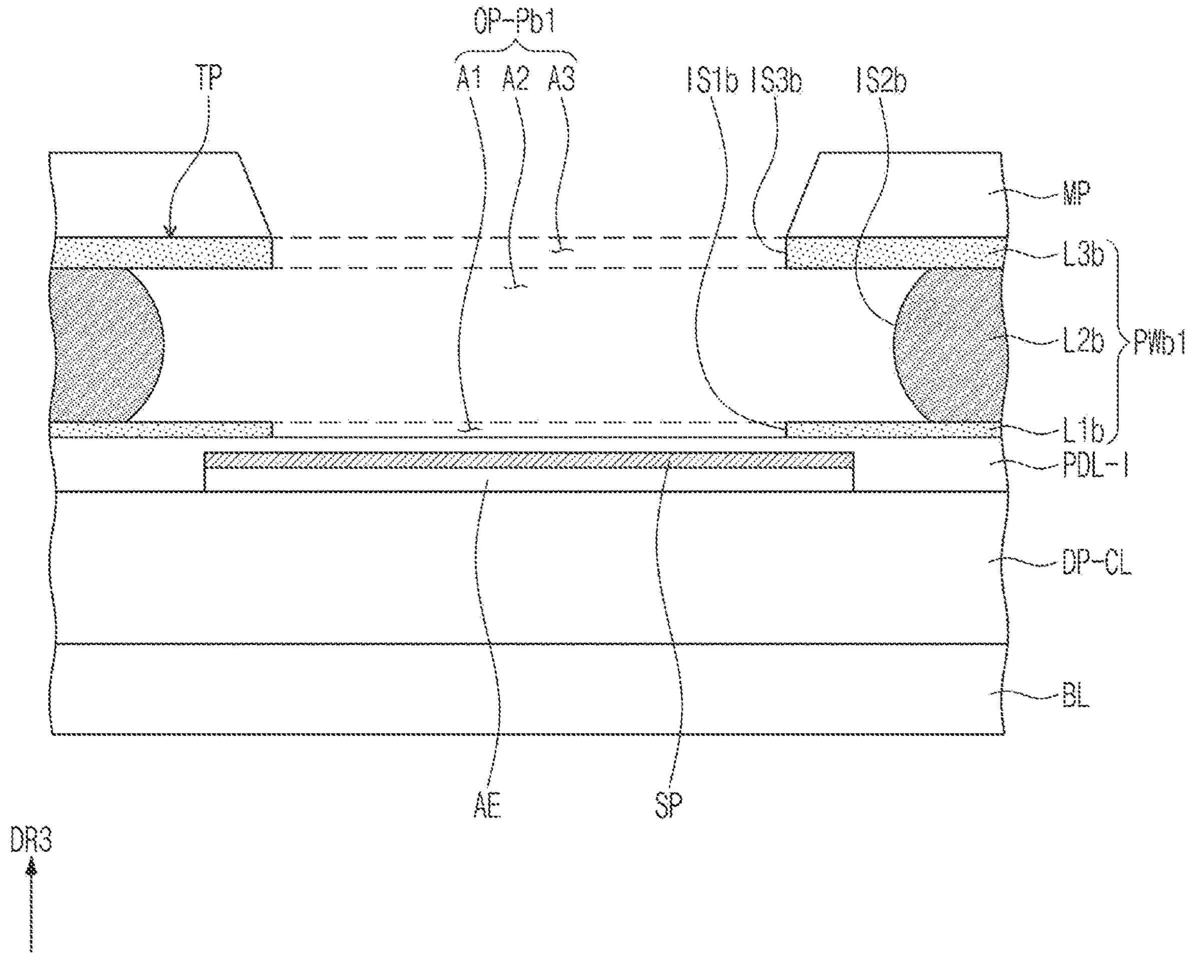

FIG. 9 is an enlarged cross-sectional view of one region of the display panel according to some embodiments of the present disclosure. FIGS. 10A to 10C are cross-sectional views illustrating steps of a method of manufacturing a display panel according to some embodiments of the present disclosure.

Referring to FIG. 9, in the display panel DP according to some embodiments, a conductive wall PWb1 may include a first layer L1*b*, a second layer L2*b*, and a third layer L3*b*. The second layer L2*b* according to some embodiments may contain silver (Ag). In this case, each of the first layer L1*b* and the third layer L3*b* may contain a transparent conductive oxide.

A partition opening OP-Pb1 may include a first region A1, a second region A2, and a third region A3. The first layer L1*b* may include a first inner side surface IS1*b* defining the first region A1 of the partition opening OP-Pb1, the second layer L2*b* may include a second inner side surface 152*b* defining the second region A2 of the partition opening OP-Pb1, and the third layer L3*b* may include a third inner side surface 153*b* defining the third region A3 of the partition opening OP-Pb1.

The second inner side surface 152*b* may be recessed relatively more inward than each of the first inner side surface IS1*b* and the third inner side surface 153*b* with respect to the light-emitting region PXA. That is, the second inner side surface 152*b* may be formed by being undercut with respect to the third inner side surface IS3*b*. In addition, a portion of the third inner side surface IS3*b* protruding from the second inner side surface IS2*b* toward the light-emitting region PXA may form a tip portion. Accordingly, the light-emitting pattern EP and the cathode CE may be physically separated by the third layer L3*b* forming the tip portion and formed in a corresponding partition opening OP-Pb1.

According to some embodiments of the present disclosure, each of the first and third inner side surfaces IS1*b* and IS3*b* may be close to being perpendicular to the upper surface of the anode AE. The second inner side surface IS2*b* may have a curvature. The second inner side surface IS2*b* may protrude in a direction approaching the light-emitting region PXA. Meanwhile, the shapes of the first to third inner side surfaces IS1*b*, IS2*b*, and IS3*b* may vary depending on the materials and/or etching process conditions of each layer.

When the second layer L2*b* contains silver (Ag), an oxide film may not be generated on an interface of the second layer L2*b*. Because the oxide film generated on the interface has an insulating property, the contact resistance of the cathode CE may be reduced as the second layer L2*b* contains a metal material having oxidation resistance.

According to some embodiments, the cathode CE may be formed of silver (Ag) or a silver (Ag) alloy having a high silver (Ag) content. Because the second layer L2*b* is made of the same material as the cathode CE, the contact resistance of the cathode CE may be minimized.

FIGS. 10A to 10C are cross-sectional views illustrating a method of forming the conductive wall PWb1, which has the partition opening OP-Pb1 defined therein, from a preliminary conductive wall layer PWb1-I. According to some embodiments, the partition opening OP-Pb1 may be formed through two wet etching processes.

Referring to FIG. 10A, the preliminary conductive wall layer PWb1-I according to some embodiments may include a first layer L1*b*, a second layer L2*b*, and a third layer L3*b*, wherein the second layer L2*b* may contain a metal material, and the first layer L1*b* and the third layer L3*b* may contain a transparent conductive oxide. For example, the second layer L2*b* may contain silver (Ag), and the first and third layers L1*b* and L3*b* may contain an indium tin oxide (ITO).

Referring to FIG. 10B, the method of manufacturing the display panel according to some embodiments may include forming a preliminary partition opening OP-Pip11in the preliminary conductive wall layer PWb1-I by performing a first wet etching process on the first to third layers L1*b*, L2*b*, and L3*b* with the use of the mask pattern MP as a mask.

The first wet etching process according to some embodiments may use a first etching solution, and the etch rate of the second layer L2*b* with respect to the first etching solution may be higher than the etch rate of the first layer L1*b* and the etch rate of the third layer L3*b*. Accordingly, the inner side surface of the second layer L2*b* among the inner side surfaces of the first to third layers L1*b*, L2*b*, and L3*b* defining the preliminary partition opening OP-Pip1I may be formed to be recessed relatively more inward than the others.

Hereafter, as illustrated in FIG. 10C, the method of manufacturing the display panel according to some embodiments may include forming a conductive wall PWb1, which has the partition opening OP-Pb1 defined therein, from the preliminary conductive wall layer PWb1-I (see FIG. 10B), which has the preliminary partition opening OP-Pip1I (see FIG. 10B) defined therein, by performing a second wet etching process on the first to third layers L1*b*, L2*b*, and L3*b* with the use of the mask pattern MP as a mask. The partition opening OP-Pb1 may include first to third regions A1, A2, and A3 respectively defined by the first to third layers L1*b*, L2*b*, and L3*b*.

The second wet etching process according to some embodiments may use a second etching solution different from the first etching solution. Compared to the first wet etching process using the first etching solution, the second wet etching process may be performed in an environment in which the etching selectivity between the second layer L2*b* and the remaining layers L1*b* and L3*b* is higher. Accordingly, the second inner side surface IS2*b* may be formed to be recessed more inward than the first and third inner side surfaces IS1*b* and IS3*b*. As a portion of the third layer L3*b* protruding from the second layer L2*b* increases, the light-emitting pattern and the cathode to be formed later may be more clearly separated by the tip portion TP of the conductive wall PWb1.

Figure 11:
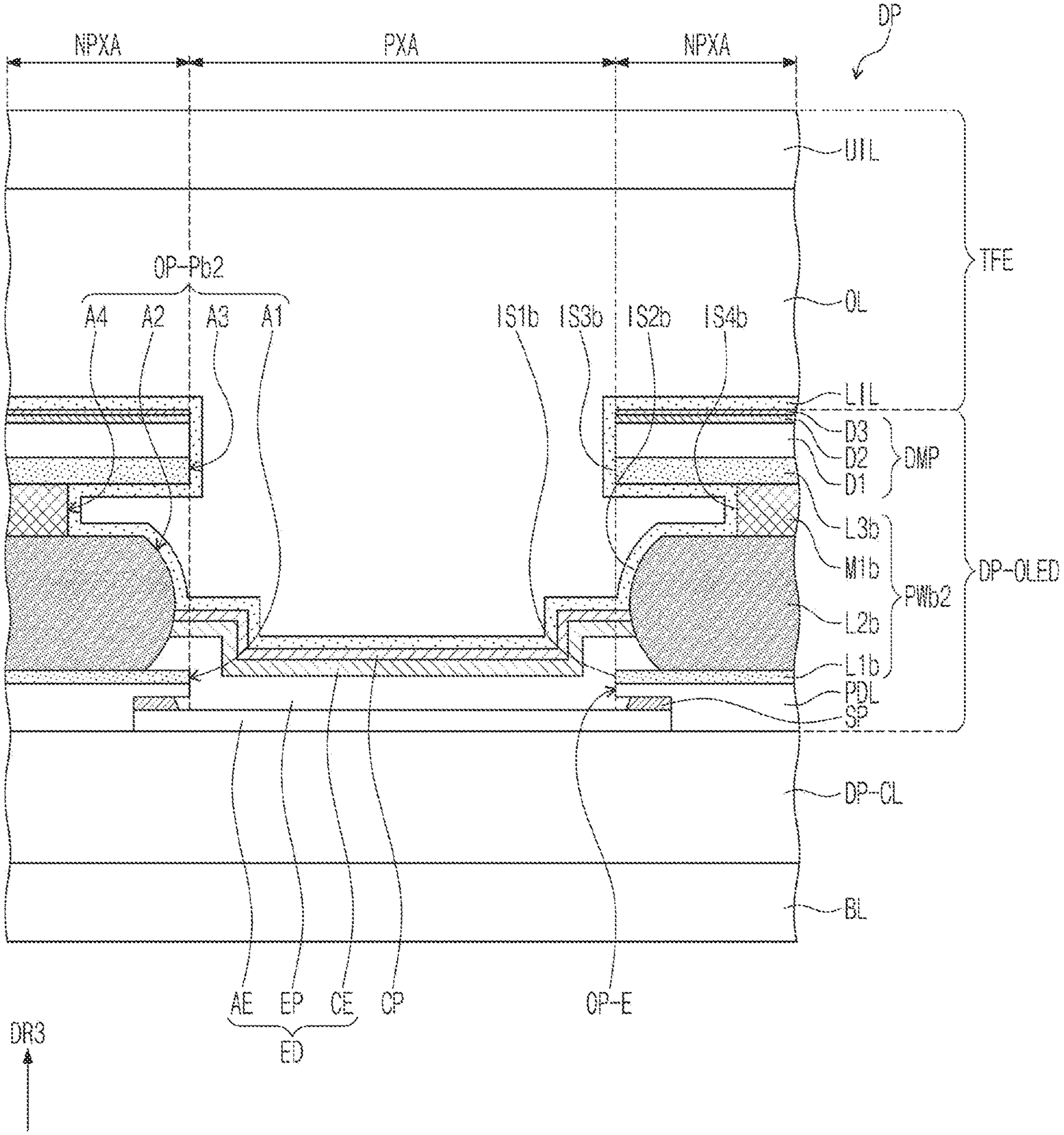
FIG. 11 is an enlarged cross-sectional view of one region of a display panel according to some embodiments of the present disclosure.
Figure 12A:
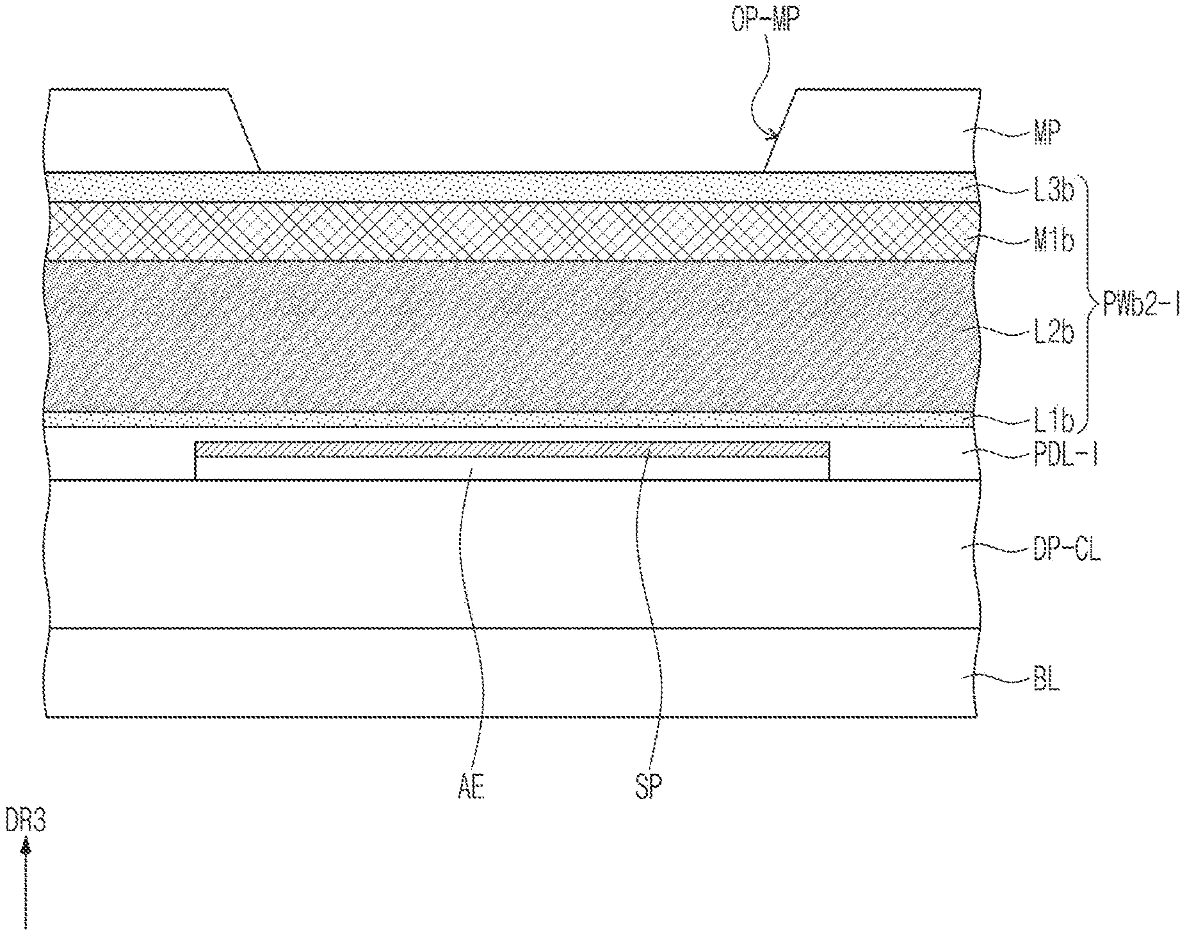
FIGS. 12A and 12B are cross-sectional views illustrating steps of a method of manufacturing the display panel according to some embodiments of the present disclosure.
Figure 12B:
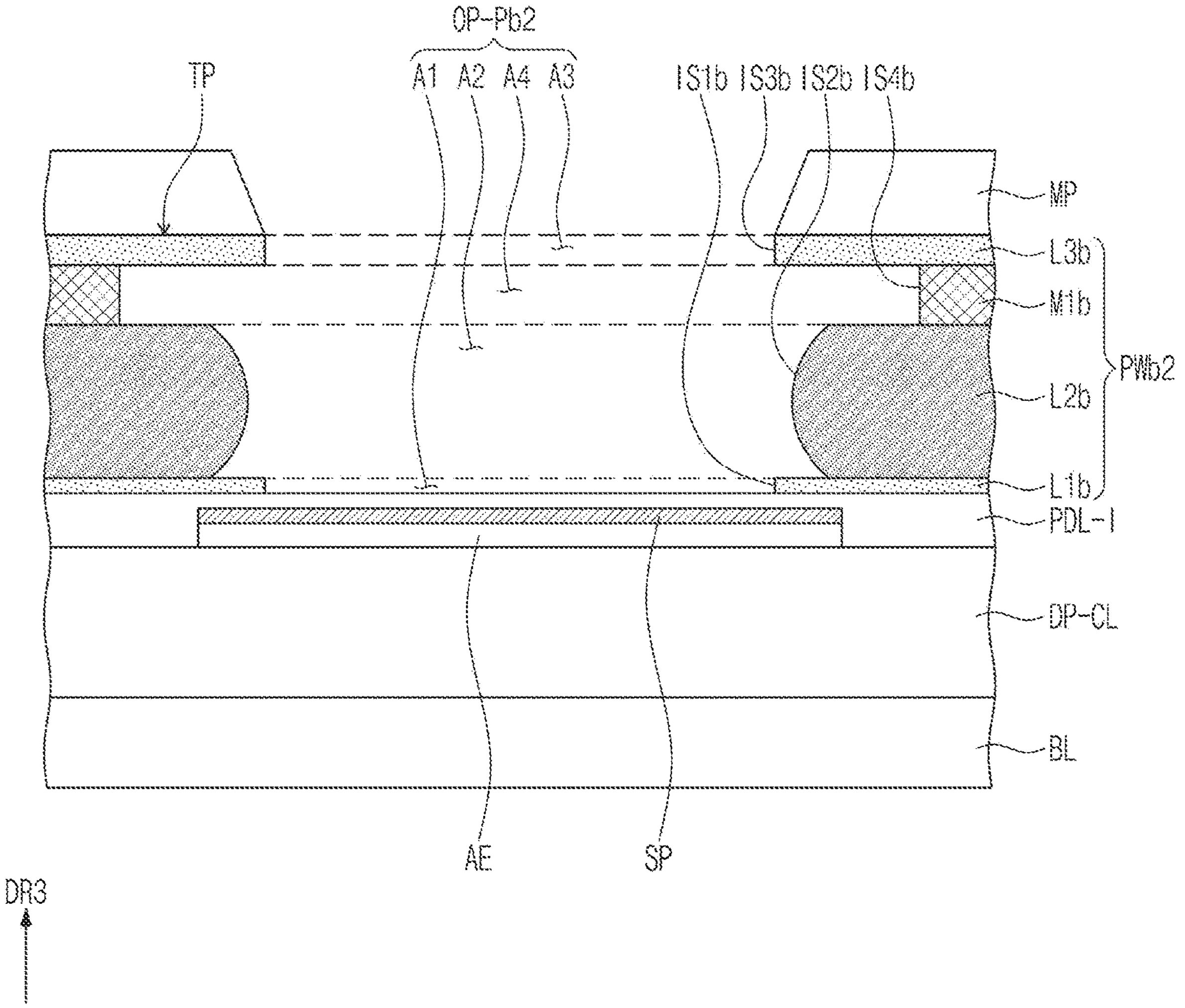

FIG. 11 is an enlarged cross-sectional view of one region of a display panel according to some embodiments of the present disclosure. FIGS. 12A and 12B are cross-sectional views illustrating steps of a method of manufacturing the display panel according to some embodiments of the present disclosure.

Referring to FIG. 11, in the display panel DP according to some embodiments of the present disclosure, a conductive wall PWb2 may include a first layer L1*b*, a second layer L2*b*, a third layer L3*b*, and a first intermediate layer M1*b*. That is, the conductive wall PWb2 of FIG. 11 may further include the first intermediate layer M1*b*, compared to the conductive wall PWb1 of FIG. 9. The first intermediate layer M1*b* may be located between the second layer L2*b* and the third layer L3*b*.

A partition opening OP-Pb2 may further include a fourth region A4 located between the second region A2 and the third region A3, and the first intermediate layer M1*b* may include a fourth inner side surface 154*b* defining the fourth region A4 of the partition opening OP-Pb2.

According to some embodiments, a second inner side surface 152*b* may be recessed more inward than a first inner side surface IS1*b* with respect to the light-emitting region PXA, and the fourth inner side surface 154*b* may be recessed more inward than each of the second inner side surface 152*b* and the third inner side surface 153*b*. That is, the fourth inner side surface 154*b* may be recessed most inward among the inner side surfaces IS1*b*, 152*b*, 153*b*, and 154*b* of the conductive wall PWb2. The fourth inner side surface 154*b* may be formed by being undercut with respect to the third inner side surface 153*b*, and a portion of the third inner side surface 153*b* protruding from the fourth inner side surface IS4*b* toward the light-emitting region PXA may form a tip portion.

According to some embodiments, the first intermediate layer M1*b* may contain a transparent conductive oxide. The first intermediate layer M1*b* may contain a material having a higher etch rate than the third layer L3*b*. In addition, the first intermediate layer M1*b* may have a higher etch rate than the second layer L2*b*. According to some embodiments of the present disclosure, the first intermediate layer M1*b* may contain any one of an indium gallium zinc oxide (IGZO) and an indium zinc oxide (IZO). In the indium zinc oxide (IZO), the indium (In) content may be equal to or higher than the zinc (Zn) content, or the zinc (Zn) content may be higher than the indium (In) content. A thickness of the first intermediate layer M1*b* may be greater than a thickness of the light-emitting pattern EP.

FIGS. 12A and 12B are cross-sectional views illustrating a method of forming the conductive wall PWb2, which has the partition opening OP-Pb2 defined therein, from a preliminary conductive wall layer PWb2-I. According to some embodiments, the partition opening OP-Pb2 may be formed through one wet etching process.

Referring to FIG. 12A, the preliminary conductive wall layer PWb2-I according to some embodiments may include a first layer L1*b*, a second layer L2*b*, a first intermediate layer M1*b*, and a third layer L3*b*. The second layer L2*b* may contain a metal material, the first layer L1*b* and the third layer L3*b* may contain a transparent conductive oxide, and the first intermediate layer M1*b* may contain a type of transparent conductive oxide different from those of the first layer L1*b* and the third layer L3*b*. For example, the second layer L2*b* may contain silver (Ag), the first and third layers L1*b* and L3*b* may contain an indium tin oxide (ITO), and the first intermediate layer M1*b* may contain any one of an indium gallium zinc oxide (IGZO) and an indium zinc oxide (IZO).

Referring to FIG. 12B, the method of manufacturing the display panel according to some embodiments may include forming the conductive wall PWb2, which has the partition opening OP-Pb2 formed therein, from the preliminary conductive wall layer PWb2-I (see FIG. 12A) by performing one wet etching process on the first to third layers L1*b*, L2*b*, and L3*b* and the first intermediate layer M1*b* with the use of the mask pattern MP as a mask. The partition opening OP-Pb2 may include a first region A1, a second region A2, a fourth region A4, and a third region A3 respectively defined by the first layer L1*b*, the second layer L2*b*, the first intermediate layer M1*b*, and the third layer L3*b*.

The wet etching process according to some embodiments may be performed in an environment in which the etching selectivity between the first intermediate layer M1*b* and the remaining layers L1*b*, L2*b*, and L3*b* is high. Accordingly, the fourth inner side surface IS4*b* may be formed to be recessed more inward than the first to third inner side surfaces IS1*b*, IS2*b*, and IS3*b*, and a portion of the third layer L3*b* protruding from the first intermediate layer M1*b* may form the tip portion TP.

According to some embodiments, by providing the first intermediate layer M1*b*, which contains a material having a high etching selectivity with respect to the second and third layers L2*b* and L3*b*, between the second layer L2*b* and the third layer L3*b*, the partition opening OP-Pb2 may be formed through a single etching process. Through this, it may be possible to provide a method of manufacturing the display panel, in which processability is improved and a process is simplified.

Figure 13:
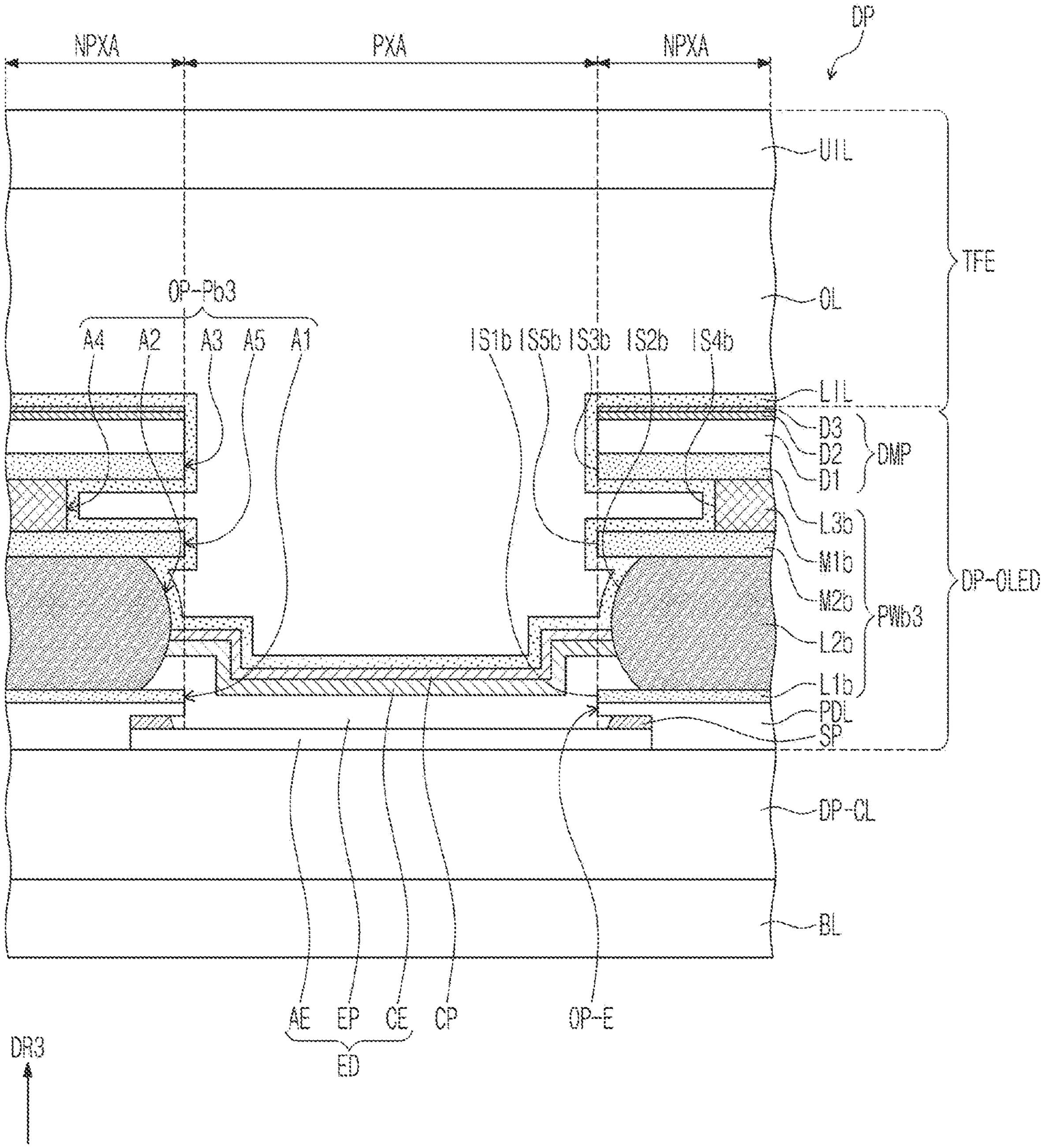
FIG. 13 is an enlarged cross-sectional view of one region of the display panel according to some embodiments of the present disclosure.

FIG. 13 is an enlarged cross-sectional view of one region of the display panel according to some embodiments of the present disclosure.

Referring to FIG. 13, in the display panel DP according to some embodiments, a conductive wall PWb3 may include a first layer L1*b*, a second layer L2*b*, a third layer L3*b*, a first intermediate layer M1*b*, and a second intermediate layer M2*b*. That is, the conductive wall PWb3 of FIG. 13 may further include a second intermediate layer M2*b*, compared to the conductive wall PWb2 of FIG. 11. The second intermediate layer M2*b* may be located between the second layer L2*b* and the first intermediate layer M1*b*.

A partition opening OP-Pb3 may further include a fifth region A5 located between the second region A2 and the fourth region A4, and the second intermediate layer M2*b* may include a fifth inner side surface IS5*b* defining the fifth region A5 of the partition opening OP-Pb3.

According to some embodiments, the second intermediate layer M2*b* may contain the same material as the third layer L3*b*. The fifth inner side surface IS5*b* of the second intermediate layer M2*b* may be substantially aligned with the third inner side surface IS3*b*. The fifth inner side surface IS5*b* may protrude toward the light-emitting region PXA from each of the second inner side surface IS2*b* and the fourth inner side surface IS4*b*. A portion of the fifth inner side surface IS5*b* protruding from the second inner side surface IS2*b* may define another tip portion.

Figure 14:
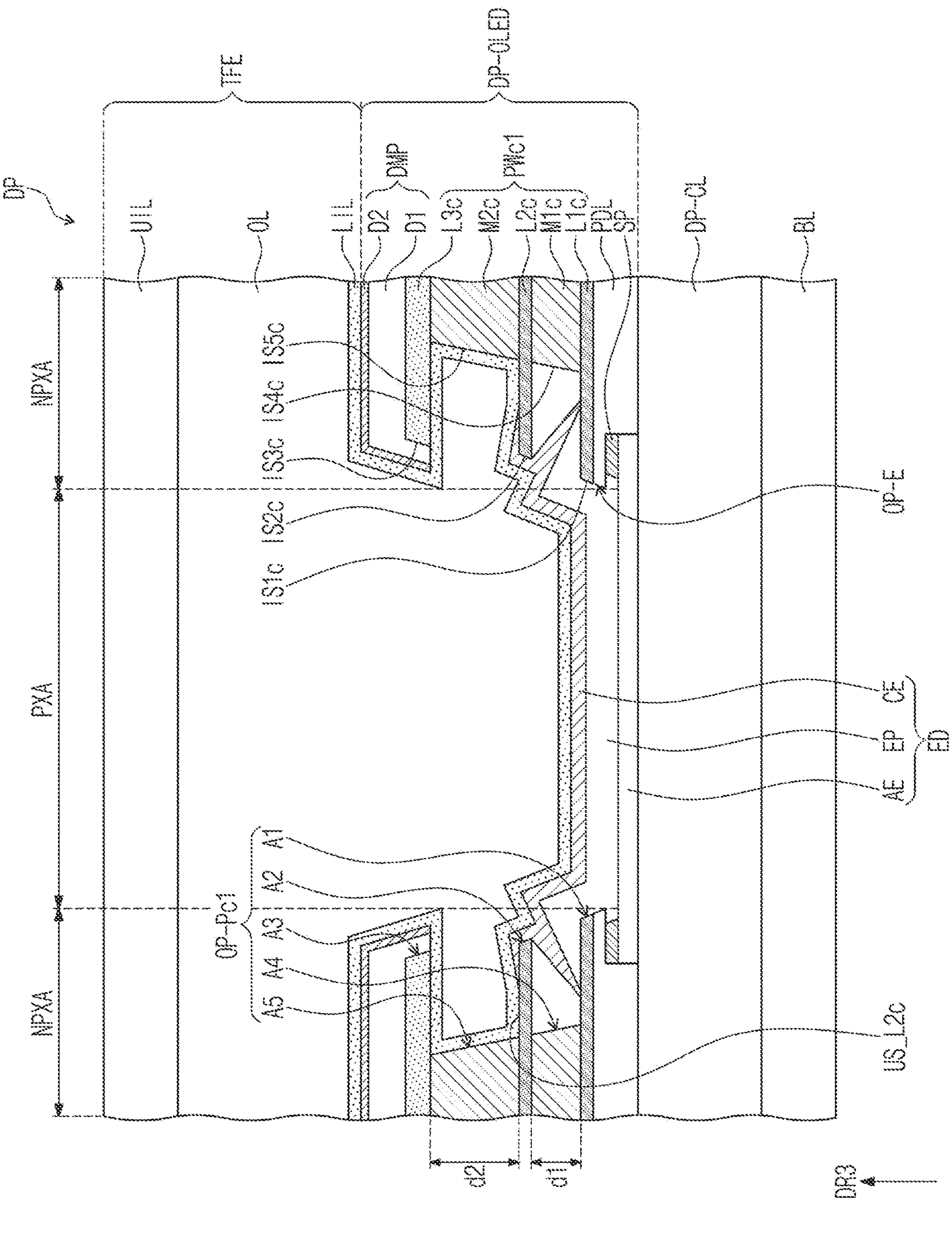
FIG. 14 is an enlarged cross-sectional view of one region of the display panel according to some embodiments of the present disclosure.
Figure 15A:
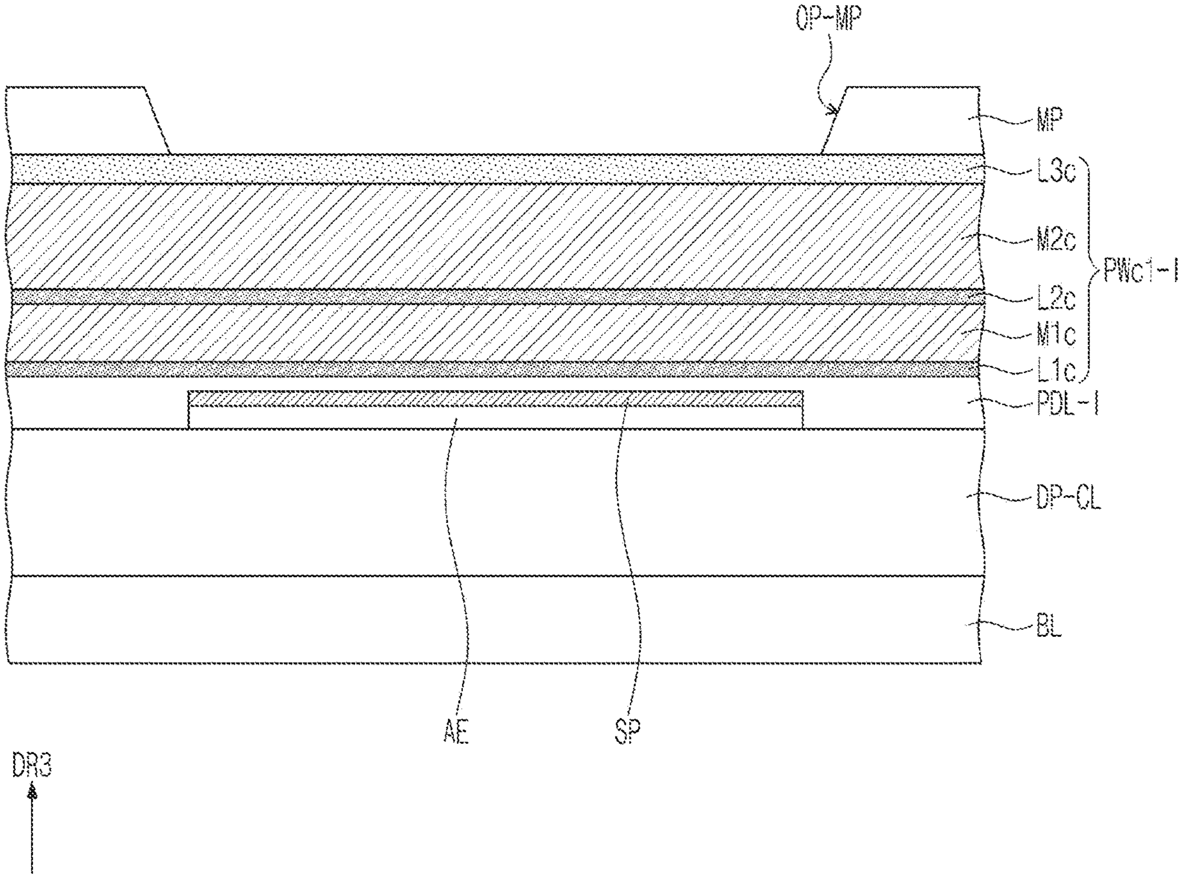
FIGS. 15A to 15C are cross-sectional views illustrating steps of a method of manufacturing the display panel according to some embodiments of the present disclosure.
Figure 15B:
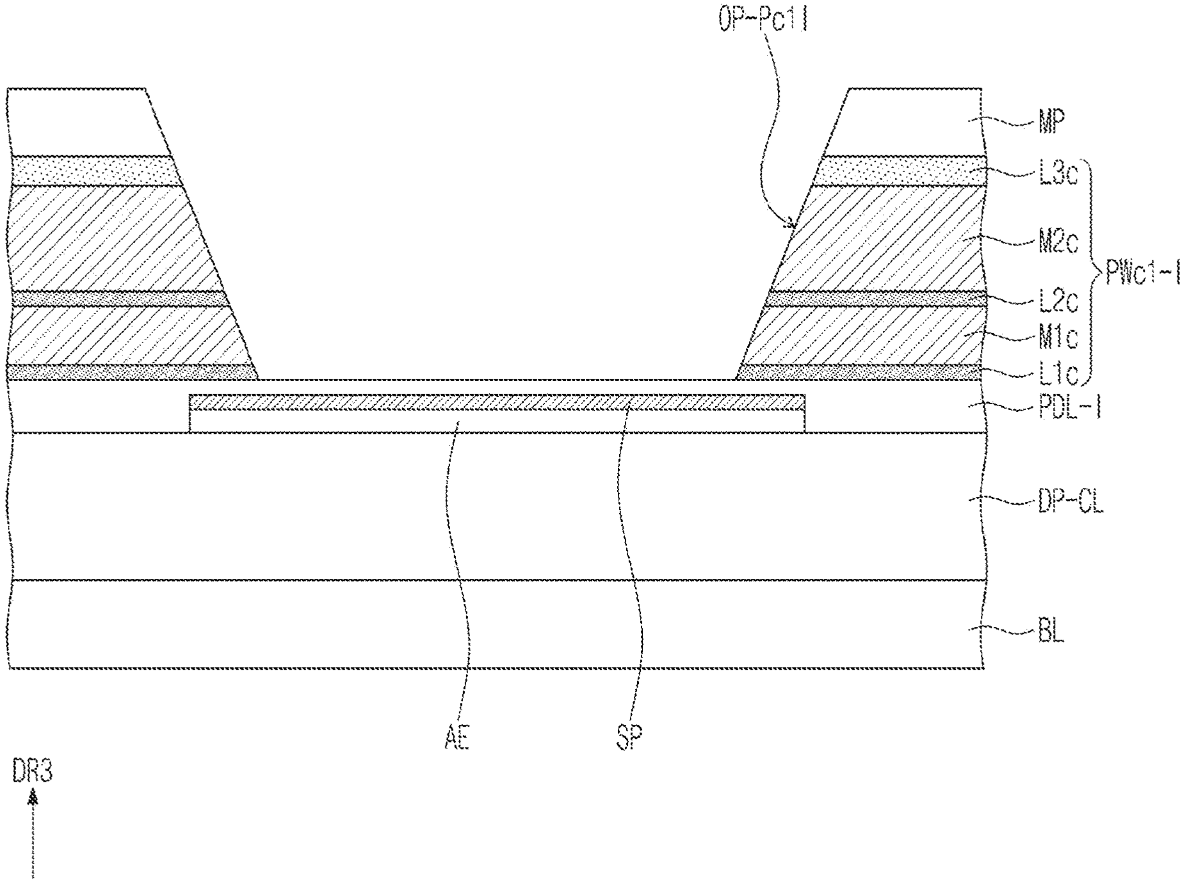
Figure 15C:
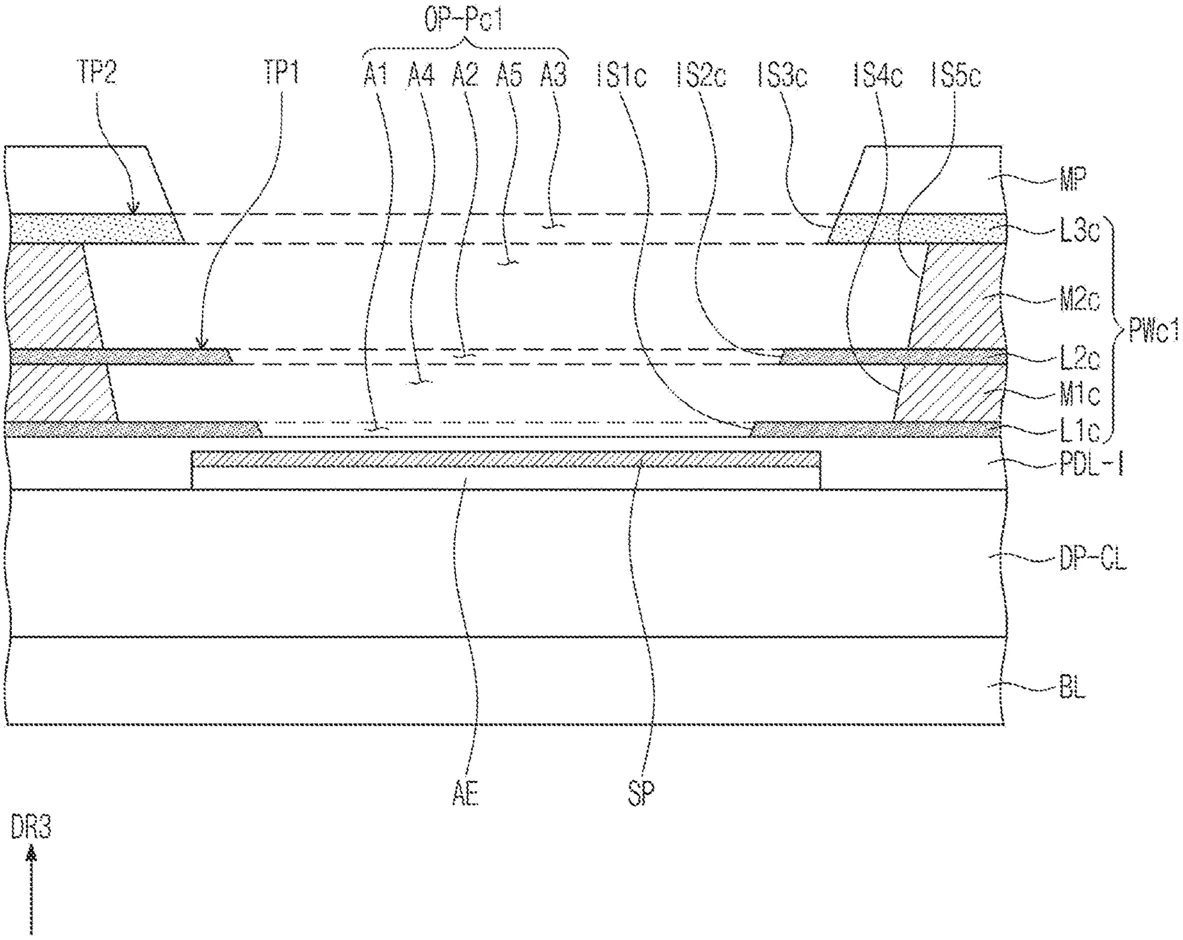

FIG. 14 is an enlarged cross-sectional view of one region of the display panel according to some embodiments of the present disclosure. FIGS. 15A to 15C are cross-sectional views illustrating steps of a method of manufacturing the display panel according to some embodiments of the present disclosure.

Referring to FIG. 14, in the display panel DP according to some embodiments, a conductive wall PWc1 may include a first layer L1*c*, a second layer L2*c*, a third layer L3*c*, a first intermediate layer M1*c* (or a fourth layer), and a second intermediate layer M2*c* (or a fifth layer). The conductive wall PWc1 of FIG. 14 may further include a first intermediate layer M1*c* and a second intermediate layer M2*c*, compared to the conductive wall PW of FIG. 5. The first intermediate layer M1*c* may be located between the first layer L1*c* and the second layer L2*c*, and the second intermediate layer M2*c* may be located between the second layer L2*c* and the third layer L3*c*.

A partition opening OP-Pc1 may include a first region A1, a second region A2, a third region A3, a fourth region A4, and a fifth region A5. The fourth region A4 may be located between the first region A1 and the second region A2, and the fifth region A5 may be located between the second region A2 and the third region A3.

The first layer L1*c* may include a first inner side surface IS1*c* defining the first region A1 of the partition opening OP-Pc1, the second layer L2*c* may include a second inner side surface IS2*c* defining the second region A2 of the partition opening OP-Pc1, and the third layer L3*c* may include a third inner side surface IS3*c* defining the third region A3 of the partition opening OP-Pc1. The first intermediate layer Mlc may include a fourth inner side surface IS4*c* defining the fourth region A4 of the partition opening OP-Pc1, and the second intermediate layer M2*c* may include a fifth inner side surface IS5*c* defining the fifth region A5 of the partition opening OP-Pc1.

According to some embodiments, the fourth inner side surface IS4*c* may be formed to be recessed more inward than each of the first inner side surface IS1*c* and the second inner side surface IS2*c* with respect to the light-emitting region PXA. The fourth inner side surface IS4*c* may be formed by being undercut with respect to the second inner side surface IS2*c*. Accordingly, a portion of the second inner side surface IS2*c* protruding from the fourth inner side surface IS4*c* may form a first tip portion TP1 (see FIG. 15C).

The cathode CE may come in contact with an upper surface US_L2*c* of the second layer L2*c*, which is exposed from the second intermediate layer M2*c*. In addition, the cathode CE may also come in contact with the second inner side surface IS2*c*. Meanwhile, depending on the thickness and/or etching process conditions of each layer, a portion of the light-emitting pattern EP may be separated in the process of forming the light-emitting pattern EP and formed on the upper surface and the second inner side surface IS2*c* of the second layer L2*c*, and in this case, the separated portion of the light-emitting pattern EP may come in contact with the upper surface US_L2*c* of the second layer L2*c* that is not covered. At this time, the cathode CE may come in contact with the upper surface US_L2*c* of the second layer L2*c* that is not covered by the separated portion of the light-emitting pattern EP.

According to some embodiments, because a first tip portion TP1 (see FIG. 15C) is further formed between the first layer L1*c* and the third layer L3*c* of the conductive wall PWc1, a surface with which the cathode CE comes in contact may be provided through the upper surface of one layer forming the first tip portion TP1 (see FIG. 15C). Accordingly, it may be possible to secure a wider contact area than being in contact with a side surface, thereby reducing the contact resistance of the cathode CE.

The fifth inner side surface IS5*c* may be formed to be recessed more inward than each of the second inner side surface IS2*c* and the third inner side surface IS3*c* with respect to the light-emitting region PXA. The fifth inner side surface IS5*c* may be formed by being undercut with respect to the third inner side surface IS3*c*. Accordingly, a portion of the third inner side surface IS3*c* protruding from the fifth inner side surface IS5*c* may form a second tip portion TP2 (see FIG. 15C). According to some embodiments, the light-emitting pattern EP and the cathode CE may be physically separated by the second tip portion TP2 (see FIG. 15C) formed in the conductive wall PWc1 and formed in a corresponding partition opening OP-Pc1.

According to some embodiments of the present disclosure, the first to fifth inner side surfaces IS1*c*, IS2*c*, IS3*c*, IS4*c*, and IS5*c* may be inclined with respect to the upper surface of the pixel defining layer PDL. For example, the interior angle formed by each of the first to fifth inner side surfaces IS1*c*, IS2*c*, IS3*c*, IS4*c*, and IS5*c* with respect to the upper surface of the pixel defining layer PDL may be an acute angle. Meanwhile, the shapes of the first to fifth inner side surfaces IS1*c*, IS2*c*, IS3*c*, IS4*c*, and IS5*c* may vary depending on the materials and/or etching process conditions of each layer.

According to some embodiments, each of the first layer L1*c* and the second layer L2*c* may contain a metal nitride, and each of the third layer L3*c*, the first intermediate layer M1*c*, and the second intermediate layer M2*c* may contain a metal material. According to some embodiments of the present disclosure, each of the first layer L1*c* and the second layer L2*c* may contain a titanium nitride (TiN), and the third layer L3*c* may contain titanium (Ti). Each of the first intermediate layer M1*c* and the second intermediate layer M2*c* may contain aluminum (Al).

Although an oxide film may be formed on the interface of the first and second intermediate layers M1*c* and M2*c* containing aluminum (Al), according to some embodiments, as the second layer L2*c* containing a metal nitride is provided, the cathode (CE) may come in contact with the interface of the second layer L2*c* on which an oxide film is not formed. That is, as the second layer L2*c* contains a metal nitride having oxidation resistance, the contact resistance of the cathode CE may be reduced.

In addition, when the second layer L2*c* contains a titanium nitride (TiN), the contact resistance of the cathode CE containing silver (Ag) and an alloy of silver (Ag) may be at a low level.

When the width of the second region A2 of the partition opening OP-Pc1 on a plane is about 3.5 micrometers, according to a comparative embodiment in which the second layer L2*c* contains aluminum (Al), the contact resistance of an electrode containing silver (Ag) is about 18 ohms (Ω), while, according to some embodiments in which the second layer L2*c* contains a titanium nitride (TiN), the contact resistance of an electrode containing silver (Ag) may be about 0.7 ohm (Ω). Accordingly, in the conductive wall PWc1 containing a titanium nitride (TiN), it can be confirmed that the contact resistance of the cathode CE containing silver (Ag) is at a low level.

According to some embodiments, in order to form the cathode CE on the second layer L2*c*, a distance d1 between the first layer L1*c* and the second layer L2*c* may be set to be smaller than the sum of the thicknesses of the light-emitting pattern EP and the cathode CE. In other words, the thickness of the first intermediate layer M1*c* may be smaller than the sum of the thicknesses of the light-emitting pattern EP and the cathode CE. For example, the distance d1 between the first layer L1*c* and the second layer L2*c*, that is, the thickness of the first intermediate layer M1*c* may be about 2500 angstroms (Å) or less.

According to some embodiments, in order to provide a space that can come in contact with the second layer L2*c* in evaporating the cathode CE, even if a residue is formed on the second layer L2*c* when the light-emitting pattern EP is separated by the second tip portion TP2 (see FIG. 15C), a distance d2 between the second layer L2*c* and the third layer L3*c* may be set to be greater than the thickness of the light-emitting pattern EP. In other words, the thickness of the second intermediate layer M2*c* may be greater than the thickness of the light-emitting pattern EP. For example, the distance d2 between the second layer L2*c* and the third layer L3*c*, that is, the thickness of the second intermediate layer M2*c* may be about 2000 angstroms (Å) or more.

FIGS. 15A to 15C are cross-sectional views illustrating a method of forming the conductive wall PWc1, which has the partition opening OP-Pc1 defined therein, from the preliminary conductive wall layer PWc1-I. According to some embodiments, the partition opening OP-Pc1 may be formed through one dry etching process and one wet etching process.

Referring to FIG. 15A, the preliminary conductive wall layer PWc1-I according to some embodiments may include a first layer L1*c*, a first intermediate layer M1*c*, a second layer L2*c*, a second intermediate layer M2*c*, and a third layer L3*c*. The first layer L1*c* and the second layer L2*c* may contain a metal nitride, and the first intermediate layer M1*c*, the second intermediate layer M2*c*, and the third layer L3*c* may contain a metal material. For example, the first layer L1*c* and the second layer L2*c* may contain a titanium nitride (TiN), the third layer L3*c* may contain titanium (Ti), and the first intermediate layer M1*c* and the second intermediate layer M2*c* may contain aluminum (Al).

Referring to FIG. 15B, the method of manufacturing the display panel according to some embodiments may include forming a preliminary partition opening OP-Pc1I in the preliminary conductive wall layer PWc1-I by performing a dry etching process on the first to third layers L1*c*, L2*c*, and L3*c* and the first and second intermediate layers M1*c* and M2*c* with the use of the mask pattern MP as a mask.

The dry etching process according to some embodiments may form the preliminary partition opening OP-Pc1I in the first to third layers L1*c*, L2*c*, and L3*c* and the first and second intermediate layers M1*c* and M2*c* through one dry etching process with the use of a Cl-containing gas.

Although FIG. 15B illustrates that the inner side surfaces of the first to third layers L1*c*, L2*c*, and L3*c* defining the preliminary partition opening OP-Pc1I are aligned with the inner side surfaces of the first and second intermediate layers M1*c* and M2*c*, the embodiments of the present disclosure are not limited thereto, and the inner side surfaces of some layers may be recessed relatively more inward than others.

Hereafter, referring to FIG. 15C, the method of manufacturing the display panel according to some embodiments may include forming the conductive wall PWc1, which has the partition opening OP-Pc1 defined therein, from the preliminary conductive wall layer PWc1I (see FIG. 15B), which has the preliminary partition opening OP-Pc1I (see FIG. 15B) defined therein, by performing a wet etching process on the first to third layers L1*c*, L2*c*, and L3*c* and the first and second intermediate layers M1*c* and M2*c* with the use of the mask pattern MP as a mask. The partition opening OP-Pc1 may include the first to fifth regions A1, A2, A3, A4, and A5 respectively defined by the first to third layers L1*c*, L2*c* and L3*c* and the first and second intermediate layers M1*c* and M2*c*.

The wet etching process according to some embodiments may be performed in an environment in which the etching selectivity between the first and second intermediate layers M1*c* and M2*c* and the remaining layers L1*c*, L2*c* and L3*c* is high. For example, the wet etching process according to some embodiments may use a polyacrylonitrile (PAN)-based etching solution. Accordingly, the fourth inner side surface IS4*c* may be formed to be recessed more inward than the first and second inner side surfaces IS1*c* and IS2*c*, and the fifth inner side surface IS5*c* may be formed to be recessed more inward than the second and third inner side surfaces IS2*c* and IS3*c*. A portion of the second layer L2*c* protruding from the first intermediate layer M1*c* may form a first tip portion TP1, and a portion of the third layer L3*c* protruding from the second intermediate layer M2*c* may form a second tip portion TP2.

Because the conductive wall PWc1 according to some embodiments is composed of the first and second layers L1*c* and L2*c* containing a titanium nitride (TiN), the third layer L3*c* containing titanium (Ti), and the first and second intermediate layers M1*c* and M2*c* containing aluminum (Al), openings (e.g., preliminary partition openings OP-Pc1I) may be simultaneously formed in the five layers through one dry etching process. Therefore, it may be possible to provide a method of manufacturing the display panel, in which processability is improved and a process is simplified.

Figure 16:
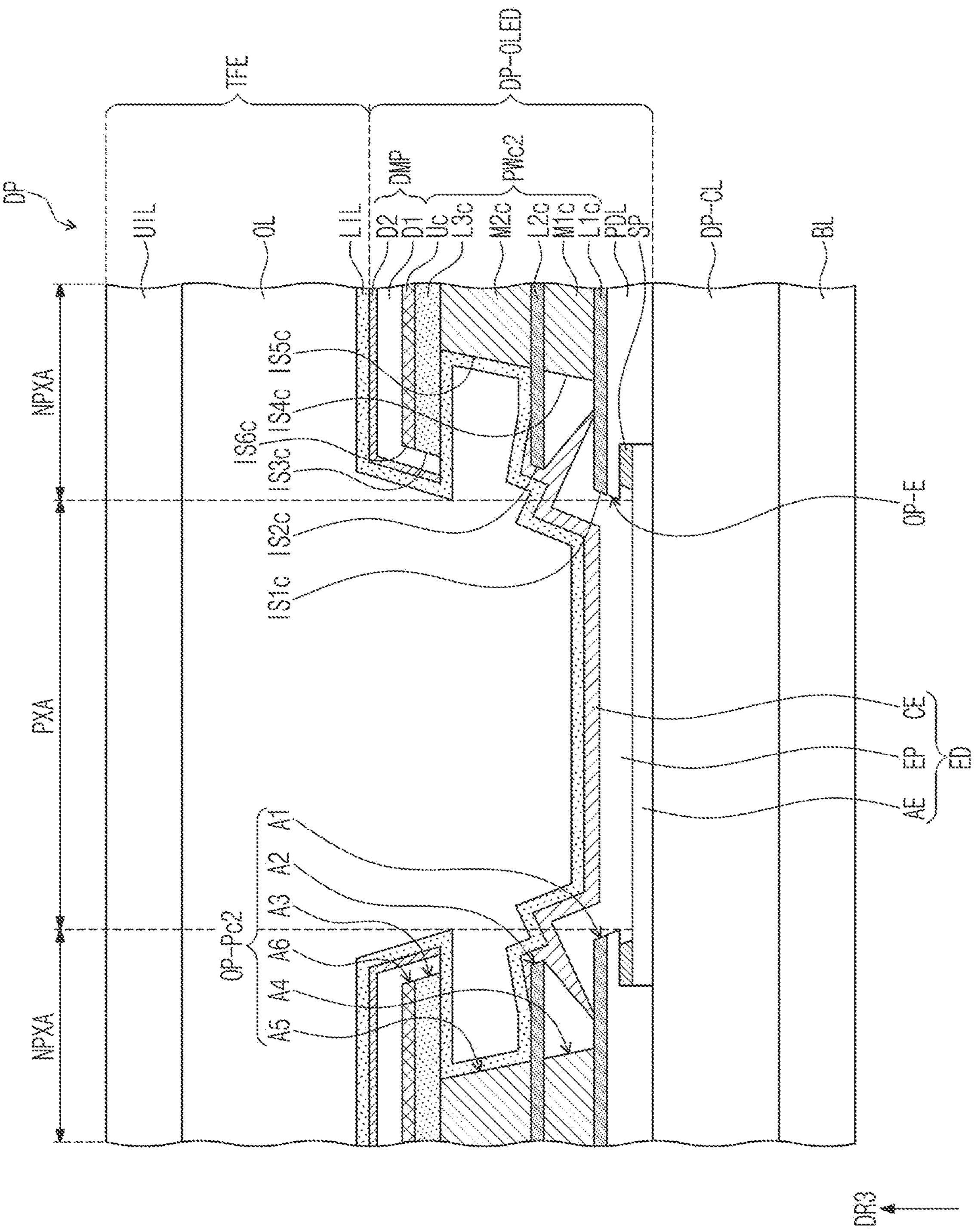
FIG. 16 is an enlarged cross-sectional view of one region of the display panel according to some embodiments of the present disclosure.

FIG. 16 is an enlarged cross-sectional view of one region of the display panel according to some embodiments of the present disclosure.

Referring to FIG. 16, in the display panel DP according to some embodiments, a conductive wall PWc2 may include a first layer L1*c*, a second layer L2*c*, a third layer L3*c*, a first intermediate layer M1*c* (or a fourth layer), a second intermediate layer M2*c* (or a fifth layer), and an upper layer Uc (or a sixth layer). The conductive wall PWc2 of FIG. 16 may further include the upper layer Uc, compared to the conductive wall PWc1 of FIG. 14. The upper layer Uc may be located on the third layer L3*c*.

The partition opening OP-Pc2 may further include a sixth region A6 located on the third region A3, and the upper layer Uc may include a sixth inner side surface IS6*c* defining the sixth region A6 of the partition opening OP-Pc2. The sixth inner side surface IS6*c* may be substantially aligned with the third inner side surface IS3*c* of the third layer L3*c*.

According to some embodiments, the upper layer Uc may have a higher modulus than the third layer L3*c*. Accordingly, a portion of the third layer L3*c*, which forms the second tip portion TP2, may be prevented from being bent or damaged due to a dummy pattern DMP formed thereon. Therefore, it may be possible to provide the display panel DP having improved process reliability. In addition, compared to a case in which the third layer L3*c* forms the uppermost portion of the conductive wall PWc2, when the conductive wall PWc2 further includes the upper layer Uc having a higher modulus on third layer L3*c*, damage to the second tip portion TP2 may be reduced although a thick third layer L3*c* is not provided.

According to some embodiments of the present disclosure, the third layer L3*c* may contain titanium (Ti), and the upper layer Uc may contain a titanium nitride (TiN). The upper layer Uc containing a titanium nitride (TiN) may have a modulus that is about 5 times greater than that of the third layer L3*c* containing titanium (Ti). In addition, according to some embodiments of the present disclosure, the first and second layers L1*c* and L2*c* may contain a titanium nitride (TiN), and the upper layer Uc may contain the same material as the first and second layers L1*c* and L2*c*.

According to some embodiments of the present disclosure, because the light-emitting layer can be patterned without a metal mask, it may be possible to provide a display panel having improved process reliability and capable of easily obtaining high resolution.

According to some embodiments of the present disclosure, by reducing the contact resistance between the electrode of the light-emitting element and the conductive wall, it may be possible to provide a display panel having increased display efficiency and improved electrical reliability.

According to some embodiments of the present disclosure, because the conductive wall includes a plurality of layers and each layer is composed of a material suitable for a patterning process (or an etching process), it may be possible to provide a display panel having improved processability.

Although the above has been described with reference to aspects of some embodiments of the present disclosure, those skilled in the art or those of ordinary skill in the art will understand that various modifications and changes can be made to the present disclosure within the scope that does not depart from the spirit and technical field of the present disclosure described in the appended claims, and their equivalents. Accordingly, the technical scope of embodiments according to the present disclosure should not be limited to the content described in the detailed description of the specification, but should be determined by the appended claims, and their equivalents.

What is claimed is:

1. A display panel comprising:
a base layer;
a first electrode on the base layer;
a pixel defining layer on the base layer and having a light-emitting opening through the pixel defining layer over a portion of the first electrode;
a conductive wall on the pixel defining layer and having a partition opening in the conductive wall corresponding to the light-emitting opening;
a second electrode in the partition opening; and
a light-emitting pattern in the partition opening and between the first electrode and the second electrode, wherein:

the conductive wall comprises a first layer, a second layer on the first layer, and a third layer on the second layer;

the second electrode contacts the second layer;

a thickness of the third layer is greater than a thickness of the first layer; and the first layer overlaps the first electrode in a plan view.

2. The display panel of claim 1, wherein the thickness of the third layer is 3000 angstroms or more and the thickness of the first layer is 2000 angstroms or less.

3. The display panel of claim 1, wherein:

the first layer comprises a first inner side surface defining a first region of the partition opening;

the second layer comprises a second inner side surface defining a second region of the partition opening; and the third layer comprises a third inner side surface defining a third region of the partition opening.

4. The display panel of claim 3, wherein:

the second inner side surface is more inward than the first inner side surface and the third inner side surface; and the second electrode contacts the second inner side surface.

5. The display panel of claim 4, wherein:

the second layer comprises copper (Cu); and each of the first layer and the third layer comprises titanium (Ti).

6. The display panel of claim 5, further comprising an auxiliary electrode on the second electrode that contacts the second inner side surface, and is thicker than the second electrode.

7. The display panel of claim 6, wherein the auxiliary electrode comprises a transparent conductive oxide.

8. The display panel of claim 4, wherein:

the second layer comprises silver (Ag); and each of the first layer and the third layer comprises a transparent conductive oxide.

9. The display panel of claim 4, wherein the second layer comprises a same material as the second electrode.

10. The display panel of claim 9, wherein the conductive wall further comprises a first intermediate layer between the second layer and the third layer and comprising a material different from that of the third layer, wherein the first intermediate layer comprises a fourth inner side surface defining a fourth region of the partition opening and more inward than each of the second inner side surface and the third inner side surface.

11. The display panel of claim 10, wherein:

the first intermediate layer comprises a transparent conductive oxide; and an etch rate of the first intermediate layer is higher than an etch rate of the third layer.

12. The display panel of claim 10, wherein:

the third layer comprises indium tin oxide (ITO); and the first intermediate layer comprises at least one of indium gallium zinc oxide (IGZO) or indium zinc oxide (IZO).

13. The display panel of claim 10, wherein a thickness of the first intermediate layer is greater than a thickness of the light-emitting pattern.

14. The display panel of claim 10, wherein the conductive wall further comprises a second intermediate layer between the first intermediate layer and the second layer and comprising a same material as the third layer, wherein the second intermediate layer comprises a fifth inner side surface defining a fifth region of the partition opening and protruding toward an inside of the partition opening from each of the second inner side surface and the fourth inner side surface.

15. The display panel of claim 3, wherein the conductive wall further comprises:

a first intermediate layer between the first layer and the second layer and comprising a fourth inner side surface defining a fourth region of the partition opening; and a second intermediate layer between the second layer and the third layer and comprising a fifth inner side surface defining a fifth region of the partition opening, wherein the second inner side surface protrudes toward an inside of the partition opening from each of the fourth inner side surface and the fifth inner side surface.

16. The display panel of claim 15, wherein the second electrode contacts an upper surface of the second layer exposed from the second intermediate layer.

17. The display panel of claim 15, wherein a distance between the first layer and the second layer is smaller than or equal to a sum of the thickness of the light-emitting pattern and the thickness of the second electrode.

18. The display panel of claim 15, wherein the fourth inner side surface is more inward than the third inner side surface.

19. The display panel of claim 15, wherein:

each of the first layer and the second layer comprises a metal nitride;

the third layer comprises a first metal; and the first intermediate layer and the second intermediate layer comprise a second metal different from the first metal of the third layer.

20. The display panel of claim 15, wherein an etch rate of each of the first intermediate layer and the second intermediate layer is higher than that of each of the first layer and the second layer.

21. The display panel of claim 15, wherein:

each of the first layer and the second layer comprises titanium nitride (TiN);

the third layer comprises titanium (Ti); and each of the first intermediate layer and the second intermediate layer comprises aluminum (Al).

22. The display panel of claim 15, wherein the conductive wall further comprises an upper layer on the third layer and comprising a sixth inner side surface defining a sixth region of the partition opening, wherein a modulus of the upper layer is greater than a modulus of the third layer.

23. The display panel of claim 1, wherein the conductive wall is configured to receive a bias voltage.

24. The display panel of claim 1, wherein the second electrode comprises silver (Ag) or an alloy comprising silver (Ag).

25. The display panel of claim 1, further comprising a dummy pattern on the conductive wall and spaced apart from the second electrode, wherein the dummy pattern comprises:

a first layer comprising a same material as the light-emitting pattern; and a second layer comprising a same material as the second electrode.

* * * * *